US012336373B2

(12) United States Patent
Lee et al.

(10) Patent No.: US 12,336,373 B2
(45) Date of Patent: Jun. 17, 2025

(54) ORGANIC LIGHT EMITTING DISPLAY DEVICE

(71) Applicant: LG Display Co., Ltd., Seoul (KR)

(72) Inventors: Jeongwon Lee, Goyang-si (KR); Seonghyun Kim, Jeonju-si (KR); JaeKi Lee, Paju-si (KR); Changyong Gong, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 2 days.

(21) Appl. No.: 17/108,559

(22) Filed: Dec. 1, 2020

(65) Prior Publication Data

US 2021/0175459 A1    Jun. 10, 2021

(30) Foreign Application Priority Data

Dec. 10, 2019    (KR) .................. 10-2019-0163770

(51) Int. Cl.
*H10K 50/813*    (2023.01)
*H10K 50/822*    (2023.01)
(Continued)

(52) U.S. Cl.
CPC ......... *H10K 50/813* (2023.02); *H10K 50/822* (2023.02); *H10K 50/844* (2023.02); *H10K 59/122* (2023.02)

(58) Field of Classification Search
CPC ............ H01L 51/5209; H01L 51/5225; H01L 51/5253; H01L 27/3246; H10K 50/813;
(Continued)

(56) References Cited

U.S. PATENT DOCUMENTS 7,091,660 B2    8/2006 Park et al.
9,478,612 B2    10/2016 Kim et al.
(Continued)

FOREIGN PATENT DOCUMENTS

CN    1518140 A    8/2004
CN    107863366 A    3/2018
(Continued)

OTHER PUBLICATIONS

China National Intellectual Property Administration, Office Action, Chinese Patent Application No. 202011379870.6, Mar. 12, 2024, 16 pages.
(Continued)

*Primary Examiner* — Shaun M Campbell
(74) *Attorney, Agent, or Firm* — Fenwick & West LLP

(57) ABSTRACT

An organic light emitting display device includes a substrate including a display area and a non-display area, an overcoat layer on the substrate, a plurality of first electrodes assigned to a plurality of sub-pixels and on the overcoat layer, a first bank in the display area and the non-display area and including a plurality of first openings exposing the plurality of first electrodes, a second bank on the first bank which is in the display area and the non-display area and including a plurality of second openings exposing the plurality of first electrodes, and an organic light emitting layer on the plurality of second openings, respectively, wherein in the non-display area, the plurality of second openings each include a first dummy opening adjacent to the display area, and wherein at least one among the plurality of second openings includes a second dummy opening extending from the first dummy opening.

14 Claims, 18 Drawing Sheets

(51) Int. Cl.
*H10K 50/844* (2023.01)
*H10K 59/122* (2023.01)

(58) Field of Classification Search
CPC .. H10K 50/822; H10K 50/844; H10K 59/122; H10K 59/873; H10K 59/35; H10K 59/805; H10K 59/88; H10K 59/353
See application file for complete search history.

(56) References Cited

U.S. PATENT DOCUMENTS

| | | | |
|---|---|---|---|
| 10,446,625 B2 | 10/2019 | Lee | |
| 10,658,442 B2 | 5/2020 | Kim et al. | |
| 2004/0140759 A1 | 7/2004 | Park et al. | |
| 2016/0035830 A1 | 2/2016 | Kim et al. | |
| 2018/0083077 A1 | 3/2018 | Lee | |
| 2019/0206956 A1* | 7/2019 | Kim | H01L 27/3246 |
| 2019/0267438 A1* | 8/2019 | Goto | H01L 27/3223 |
| 2019/0371872 A1* | 12/2019 | Nendai | H10K 59/124 |
| 2019/0371873 A1* | 12/2019 | Cui | H01L 51/56 |
| 2020/0052052 A1* | 2/2020 | Nishimura | H10K 71/13 |
| 2020/0194518 A1* | 6/2020 | Myung | H10K 59/122 |
| 2020/0243621 A1* | 7/2020 | Zhao | B41J 3/407 |
| 2021/0050396 A1* | 2/2021 | Myung | H10K 59/10 |
| 2021/0183973 A1* | 6/2021 | Kim | H10K 59/35 |
| 2021/0202614 A1* | 7/2021 | Kim | H10K 59/122 |

FOREIGN PATENT DOCUMENTS

| | | |
|---|---|---|
| JP | 2010-277944 A | 12/2010 |
| KR | 10-2015-0105596 A | 9/2015 |
| KR | 10-2016-0017703 A | 2/2016 |
| KR | 10-2019-0081953 A | 7/2019 |
| KR | 10-2020-0075607 A | 6/2020 |
| WO | WO 2018/196271 A1 | 11/2018 |

OTHER PUBLICATIONS

Korean Intellectual Property Office, Office Action, Korean Patent Application No. 10-2019-0163770, May 1, 2025, 15 pages.

* cited by examiner

ORGANIC LIGHT EMITTING DISPLAY DEVICE

CROSS-REFERENCE TO RELATED APPLICATIONS

This application claims the priority of Republic of Korea Patent Application No. 10-2019-0163770 filed on Dec. 10, 2019, in the Korean Intellectual Property Office, the disclosure of which is incorporated by reference in its entirety.

BACKGROUND

Technical Field

The present disclosure relates to an organic light emitting display device.

Related Technology

Recently, various display devices have been developed that can reduce weight and size, which are disadvantages of cathode ray tubes. Such display devices include liquid crystal display (LCD), plasma display panel (PDP), field emission display (FED), organic light emitting display device (OLED), and the like.

The organic light emitting display device is a self-emission device that emits light by itself, and has a fast response speed, high light emission efficiency, high brightness, and a wide viewing angle. In addition, since a device can be formed on a flexible substrate such as plastic, a flexible display device can be implemented.

Recently, as an organic light emitting display device with a large-area and high resolution is required, a plurality of sub-pixels is included in a single panel. In general, since a mask is used for patterning red R, green G, and blue B sub-pixels to realize a large-area display device, a fine metal mask (FMM) corresponding to said large-area is required. However, a phenomenon in which the mask sags occurs as the area increases, and various defects such as misplaced deposition problem of the organic light emitting material constituting the light emitting layer can be caused.

In order to solve the problems of the deposition using the above-described mask, a simple but advantageous solution process for a large-area is attracting attention. The solution process is capable of large-area patterning without a mask through inkjet printing or nozzle printing, and has a material use rate of 50% to 80% which is higher than that of vacuum deposition with a material use rate of 10% or less. In addition, its glass transition temperature is higher than that of the vacuum-deposited thin film, so it has excellent thermal stability and superior morphology characteristics.

However, when the light emitting layer is formed by the solution process, a thickness non-uniformity occurs due to a thickness variation depending on the position in the sub-pixel, resulting in a problem that the display quality is significantly lowered.

SUMMARY

Accordingly, an object of the present disclosure is to provide an organic light emitting display device having a heterogeneous bank structure.

According to the present disclosure, an organic light emitting display device may include a substrate including a display area including a plurality of sub-pixels and a non-display area disposed outside the display area; an overcoat layer disposed on the substrate; a plurality of first electrodes assigned to the plurality of sub-pixels and disposed on the overcoat layer; a first bank disposed in the display area and the non-display area and including a plurality of first openings exposing the plurality of first electrodes; a second bank disposed on the first bank which disposed in the display area and the non-display area, and including a plurality of second openings exposing the plurality of first electrodes arranged in one direction; and an organic light emitting layer disposed on the plurality of second openings, respectively, wherein in the non-display area, the plurality of second openings each include a first dummy opening adjacent to the display area, and wherein at least one among the plurality of second openings includes a second dummy opening extended from the first dummy opening.

The first dummy opening may be overlapped with the plurality of first openings of the first bank.

The second dummy opening may be disposed adjacent to the outermost portion of the substrate, and at least partially overlaps the overcoat layer.

The second dummy opening may be non-overlapping with the overcoat layer.

The second dummy opening may be non-overlapping with the first openings of the first bank.

The plurality of second openings may include a first column in which the same organic light emitting layers are formed, a second column in which organic light emitting layers different from the organic light emitting layers in the first column are formed, and a third column in which organic light emitting layers different from the organic light emitting layers in the first and second columns are formed.

The second dummy opening may be included in at least one of the first column, the second column, and the third column.

The second dummy opening may be included in each of the first column, the second column, and the third column, and the second dummy openings included in each of the first column, the second column, and the third column may have different planar areas.

The second dummy opening included in the first column may have a smaller planar area than the planar areas of the second dummy openings included in each of the second column and the third column, and the planar area of the second dummy openings included in the second column may be larger than the planar areas of the second dummy openings included in the first column and the third column, respectively.

At least one of the second dummy opening may be formed by bending and protruding into at least one adjacent column.

At least one of the first to third columns does not include the second dummy opening, and the second dummy opening included in the remaining columns of the first to third columns may be formed by bending and protruding into adjacent columns.

The second dummy opening may include a bottleneck part connected to the first dummy opening.

The bottleneck part may have a width narrower than the width of the first dummy opening at the end of the first dummy opening.

The width of the bottleneck part may be 20 to 40% of the width of the first dummy opening.

According to the present disclosure, by forming the first dummy opening and the second dummy opening of the second bank in the dummy area of the non-display area, the organic light emitting material is held so that the organic light emitting material does not gather from the edge portion, that is, the dummy area to the center of the display area, and by generating a capillary phenomenon, it is possible to maintain the organic light emitting material in a dummy area with a uniformed thickness.

Therefore, in the solution process, there is an advantage that can significantly improve the degradation of the display quality due to the thickness variation of the organic light emitting layer according to the position.

DETAILED DESCRIPTION

Hereinafter, embodiments of the present disclosure will be described with reference to the accompanying drawings. Throughout the specification, the same reference numbers refer to substantially the same elements. In the following description, when it is considered that the detailed description of the conventional art or configuration related to the present disclosure may unnecessarily obscure the subject matter of the present disclosure, the detailed description may be omitted. In describing various embodiments, the same elements may be representatively described at the outset and may be omitted in other embodiments.

Terms including ordinal numbers such as first and second may be used to describe various elements, but the elements are not limited by the terms. The terms are used only for the purpose of distinguishing one element from other elements.

Figure 1:
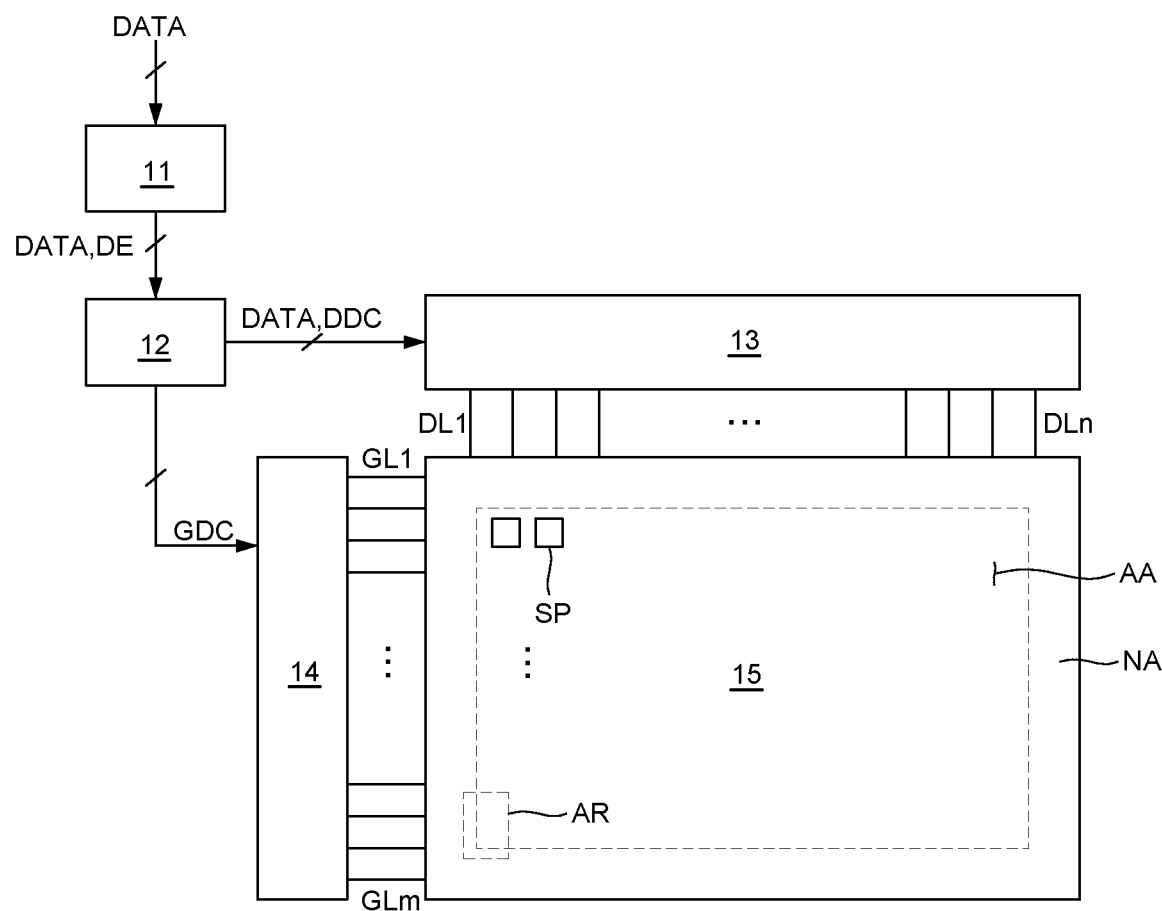
FIG. 1 is a schematic block diagram of an organic light emitting display device according to one embodiment.
Figure 2:
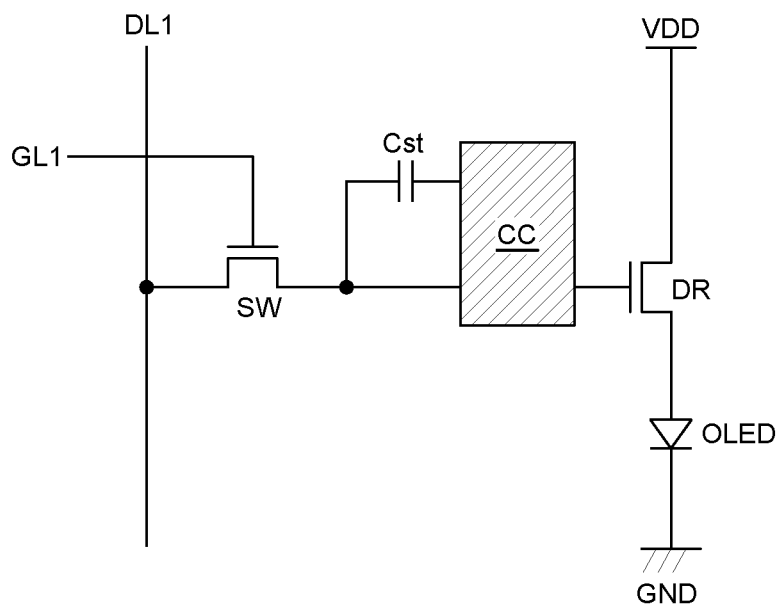
FIGS. 2 and 3 are schematic views showing the sub-pixels shown in FIG. 1 according to one embodiment.
Figure 3:
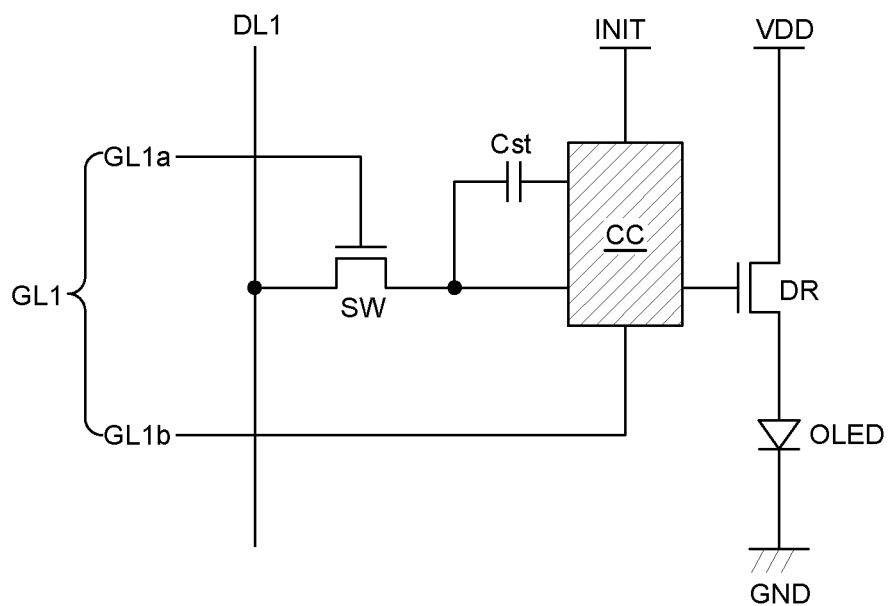

FIG. 1 is a schematic block diagram of an organic light emitting display device. FIGS. 2 and 3 are schematic diagrams of sub-pixels illustrated in FIG. 1.

Referring to FIG. 1, the organic light emitting display device includes an image processing unit 11, a timing control unit 12, a data driving unit 13, a gate driving unit 14, and a display panel 15.

The image processing unit 11 outputs a data enable signal DE and the like along with a data signal DATA supplied from the outside. The image processing unit 11 may output one or more of a vertical synchronization signal, a horizontal synchronization signal, and a clock signal in addition to the data enable signal DE, but these signals may be omitted for convenience of explanation. The image processing unit 11 is formed in the form of an integrated circuit IC on the system circuit board.

The timing control unit 12 receives a data signal DATA along with a driving signal including a data enable signal DE or a vertical synchronization signal, a horizontal synchronization signal, and a clock signal from the image processing unit 11.

The timing control unit 12 outputs a gate timing control signal GDC for controlling the operation timing of the gate driving unit 14 and a data timing control signal DDC for controlling the operation timing of the data driving unit 13 based on the driving signal. The timing control unit 12 is formed in the form of an IC on the control circuit board.

The data driving unit 13 samples and latches the data signal DATA supplied from the timing control unit 12 in response to the data timing control signal DDC supplied from the timing control unit 12 to convert it into a gamma reference voltage and then output. The data driving unit 13 outputs the data signal DATA through the data lines DL1 to DLn. The data driving unit 13 is formed on the data circuit board in the form of an IC and can be attached to the display panel 15.

The gate driving unit 14 outputs a gate signal while shifting the level of the gate voltage in response to the gate timing control signal GDC supplied from the timing controller 12. The gate driving unit 14 outputs a gate signal through the gate lines GL1 to GLm. The gate driving unit 14 may be formed in the form of an IC on the gate circuit board to be attached to the display panel 15, or may be formed on the display panel 15 by a gate in panel method.

The display panel 15 includes a display area AA for displaying an image and a non-display area NA disposed outside the display area AA. The display area AA includes sub-pixels SP. The sub-pixels may be defined by a crossing structure of signal lines.

The display panel 15 displays an image corresponding to the data signal DATA and the gate signal supplied from the data driving unit 13 and the gate driving unit 14 respectively. The non-display area NA includes pads on which a circuit board is bonded and receives a signal from the circuit board, and link lines connected to the pads to transmit the signal to sub-pixels SP of the display area AA.

Referring to FIG. 2, one sub-pixel includes a switching transistor SW, a driving transistor DR, a compensation circuit CC, and an organic light emitting diode OLED. The organic light emitting diode OLED operates to emit light according to the driving current generated by the driving transistor DR.

The switching transistor SW operates to switch the data signal supplied through the first data line DL1 to be stored as a data voltage in the capacitor in response to the gate signal supplied through the first gate line GL1. The driving transistor DR operates such that a driving current flows between the high potential power line VDD and the low potential power line GND according to the data voltage stored in the capacitor. The compensation circuit CC is a circuit for compensating the threshold voltage of the driving transistor DR. Also, a capacitor connected to the switching transistor SW or the driving transistor DR may be located inside the compensation circuit CC.

The compensation circuit CC includes one or more thin film transistors and capacitors. The configuration of the compensation circuit CC can be very diverse according to the compensation method, and detailed examples and descriptions thereof may be omitted accordingly.

In addition, as shown in FIG. 3, when the compensation circuit CC is included, the sub-pixel further includes a signal line and a power line for driving a compensation thin film transistor and supplying a specific signal or power. The added signal line may be defined as a 1-2 gate line GL1b for driving the compensation thin film transistor included in the sub-pixel. In addition, the added power line may be defined as an initialization power line INIT GL1a for initializing a specific node of a sub-pixel to a specific voltage. However, this is merely for an example and is not limited thereto.

Meanwhile, in FIGS. 2 and 3, a compensation circuit CC included in one sub-pixel is illustrated as an example. However, the compensation circuit CC may be omitted when the subject of compensation is located outside the sub-pixel, such as the data driving unit 13. That is, one sub-pixel is basically configured of a 2T (Transistor) and 1C (Capacitor) structure including a switching transistor SW, a driving transistor DR, a capacitor, and an organic light emitting diode OLED, but when a compensation circuit CC is added, it may be variously configured such as 3T1C, 4T2C, 5T2C, 6T2C, and 7T2C.

The First Embodiment

Figure 4:
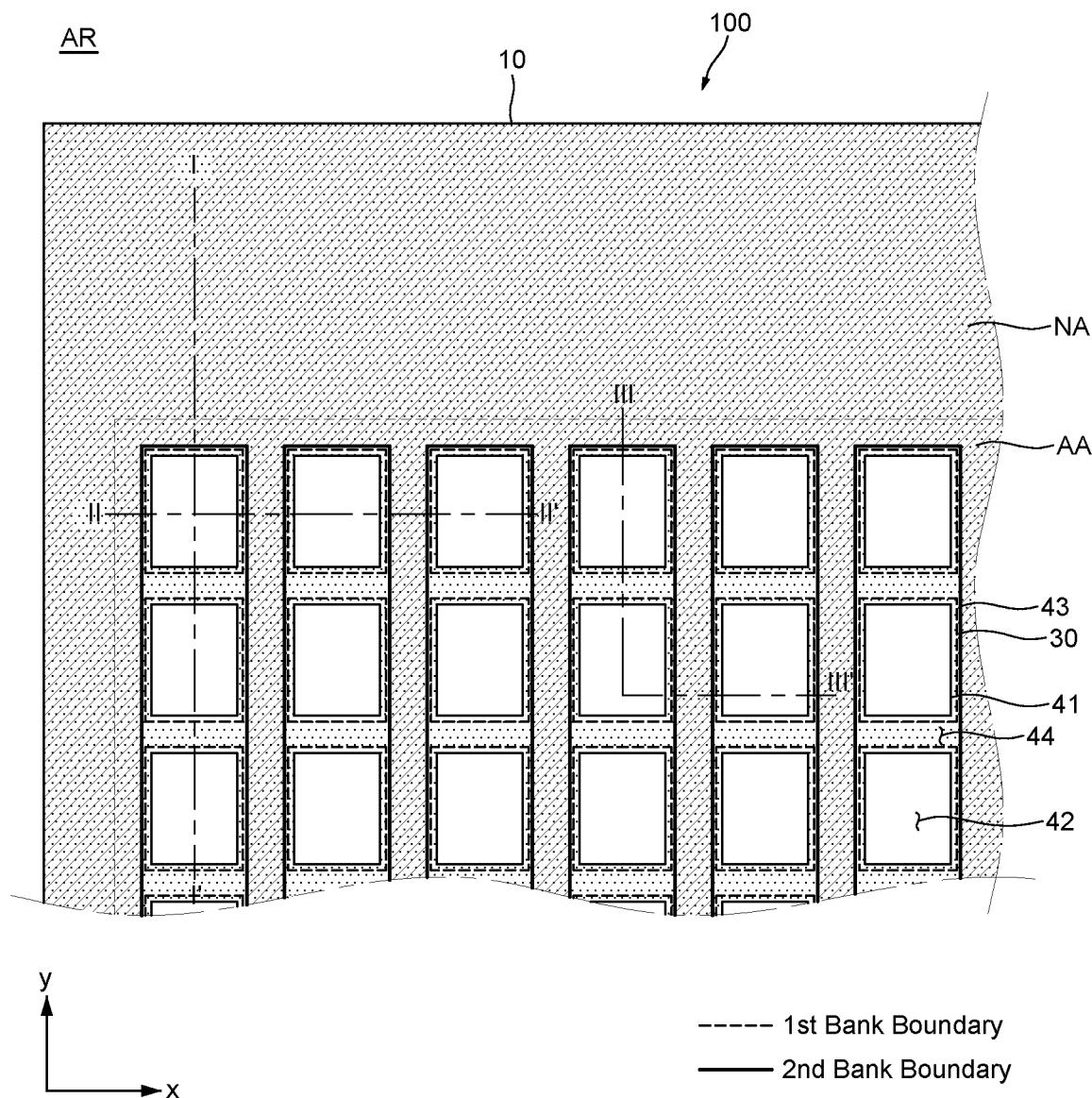
FIG. 4 is a plan view schematically showing an organic light emitting display device according to a first embodiment of the present disclosure.
Figure 5A:
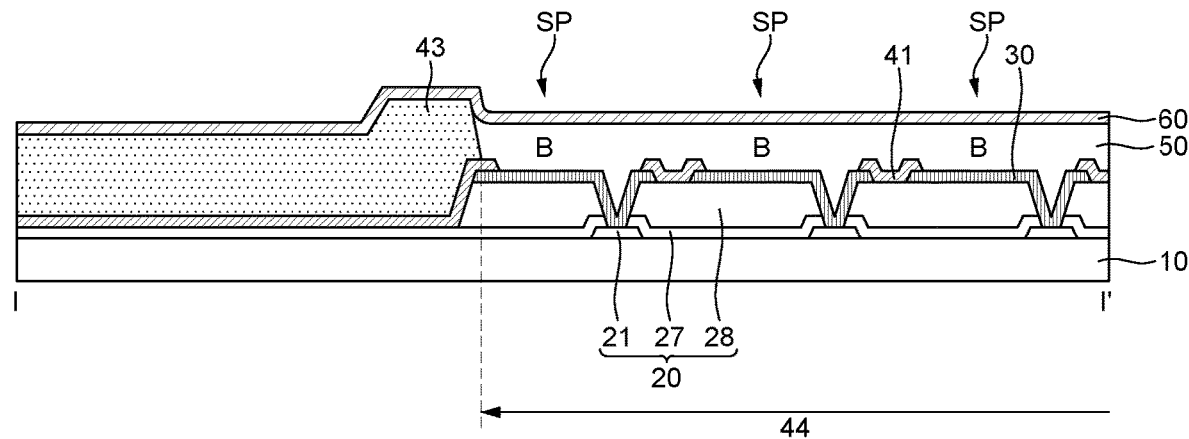
FIG. 5A is a cross-sectional view taken along lines I-I' of FIG. 4

FIG. 4 is a schematic view of an organic light emitting display device according to a first embodiment of the present disclosure, and is an enlarged plan view of the AR area of FIG. 1. FIG. 5A is a cross-sectional view taken along lines I-I' of FIG. 4 and FIG. 5B is a cross-sectional view taken along lines II-If of FIG. 4.

Figure 5B:
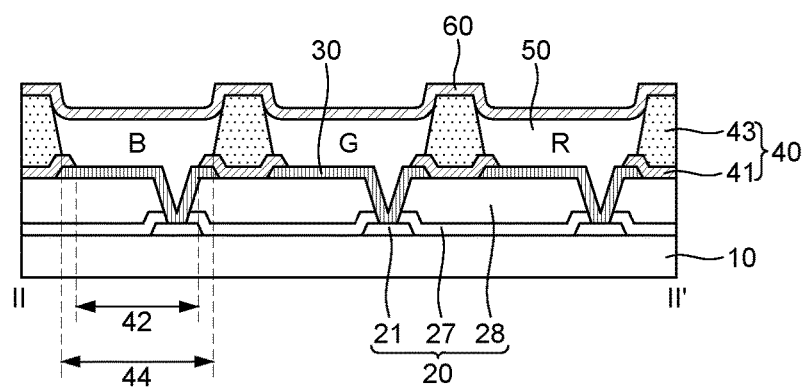
FIG. 5B is a cross-sectional view taken along lines II-II' of FIG. 4 according to one embodiment.

Referring to FIGS. 4, 5A and 5B, the organic light emitting display device 100 according to the first exemplary embodiment of the present disclosure includes a substrate 10 including a display area AA in which sub-pixels SP are arranged and a non-display area NA disposed outside the display area AA. The substrate 10 may have various planar shapes. For example, as shown in the drawing, it may include any kind of planar shapes such as a square, a circle, and an oval as well as a rectangle. In the substrate 10, a first direction, for example, X-axis direction and a second direction, for example, Y-axis direction intersecting each other may be defined regardless of the planar shape of the substrate 10. Positions and arrangement relationships of sub-pixels and/or openings, which will be described later, may be defined by the first direction and the second direction.

On the substrate 10, the circuit element layer 20 and the organic light emitting diode driven by the elements provided in the circuit element layer 20 are disposed.

In the circuit element layer 20, signal lines and electrodes for applying a driving signal to the organic light emitting diode may be arranged, and the signal lines and the electrodes may be separated with at least one insulating layer therebetween as necessary. When the organic light emitting display device is implemented in an active matrix AM method, the circuit element layer 20 may further include a thin film transistor 21 allocated for each sub-pixel SP. Hereinafter, for convenience of description, a case where a thin film transistor 21 is allocated for each sub-pixel will be described as an example. At this time, the passivation layer 27 and the overcoat layer 28 are interposed between the thin film transistor 21 and the organic light emitting diode. The passivation layer 27 includes an inorganic material and protects the internal element. The overcoat layer 28 includes a certain organic material, and is formed to have a predetermined thickness to compensate for a step difference caused by the thin film transistor 21 and signal lines formed thereunder.

The organic light emitting diode includes a first electrode 30, a second electrode 60, and an organic light emitting layer 50 interposed between the first electrode 30 and the second electrode 60. The first electrode 30 may be an anode, and the second electrode 60 may be a cathode.

More specifically, the sub-pixels SP may be arranged along a first direction and a second direction intersecting each other. Sub-pixels SP arranged adjacent to the first direction may emit light of different colors, and the sub-pixels SP arranged adjacent to the second direction may emit light of the same color. In the sub-pixels SP, the first electrode 30 of the organic light emitting diode is disposed. The first electrode 30 may be assigned to each of the sub-pixels SP.

On the first electrode 30, the bank 40 is disposed. The bank 40 includes a first bank 41 and a second bank 43.

The first bank 41 is positioned on the first electrode 30. The first bank 41 includes a first opening 42 exposing at least a portion of the first electrode 30. One first opening 42 exposes a corresponding one first electrode 30. Therefore, the number of the first openings 42 and the number of the first electrodes 30 may correspond to each other.

The first bank 41 may be formed with a relatively thin thickness so that it can be covered by the organic light emitting layer 50. The first bank 41 may have hydrophilic properties. For example, the first bank 41 may be formed of a hydrophilic inorganic insulating material such as silicon oxide SiOx or silicon nitride SiNx.

In the drawing, the case where the first opening 42 having an approximately rectangular shape is illustrated as an example, but is not limited thereto. In addition, although the first openings 42 are all illustrated to have the same shape and area, the present disclosure is not limited thereto, and at least one of the first openings 42 may have different shape and/or area from the other first opening 42. For example, the shape and/or area of the first opening 42 may be appropriately selected in consideration of the life-time of the organic light emitting material for forming the organic light emitting layer 50 of the organic light emitting diode. A portion of the first electrode 30 exposed by the first opening 42 may be defined as a light emitting region.

On the substrate 10 on which the first bank 41 is formed, the second bank 43 is located. The second bank 43 includes a second opening 44 exposing at least a portion of the first electrode 30. The plurality of second openings 44 are arranged side by side in the first direction, and each extends in the second direction. The second opening 44 extends in the second direction to expose a plurality of first electrodes 30 disposed along the second direction. Alternatively, the second opening 44 extends in the second direction to expose a plurality of first openings 42 disposed along the second direction.

The second bank 43 may have hydrophobic characteristics. Alternatively, the upper and side surfaces of the second bank 43 may have hydrophobic characteristics. For example, the second bank 43 may have a shape in which a material having a hydrophobic property is coated on the insulating material, and may be formed of an insulating material including a hydrophobic material. The second bank 43 may be made of an organic material. The hydrophobic property of the second bank 43 may function to push the organic light emitting material constituting the organic light emitting layer 50 to the central portion of the light emitting region. In addition, the second bank 43 may function as a barrier that traps the organic light emitting material dropped in the corresponding region so as to suppress the organic light emitting materials of different colors from being mixed with each other.

In the drawings, the case where the second opening 44 has an approximately rectangular shape is illustrated as an example, but is not limited thereto. In addition, although the second openings 44 are all illustrated to have the same shape and area, the present disclosure is not limited thereto, and at least one second opening 44 may have different shape and/or area from the other second opening 44. For example, the shape and/or area of the second opening 44 may be appropriately selected in consideration of the life-time of the organic light emitting material.

The second opening 44 is spaced apart from the first opening 42. That is, the boundary of the first bank 41 is separated from the boundary of the second bank 43 by a predetermined interval. Accordingly, the first opening 42 may be exposed by the second opening 44.

On the substrate 10 on which the second bank 43 is formed, the organic light emitting layer 50 is positioned. The organic light emitting layer 50 may be formed in the corresponding second opening 44 along the extending direction of the second opening 44. That is, the organic light emitting material dropped on one second opening 44 covers the first electrodes 30 and the first banks 41 exposed by the second opening 44 and it is not physically separated by the first bank 41.

On the plurality of first electrodes 30 exposed by one second opening 44, an organic light emitting material of the same color is dropped. This means that light of the same color is emitted from a plurality of sub-pixels SP allocated to a position corresponding to one second opening 44. The planar shape of the organic light emitting layer 50 may correspond to the planar shape of the second opening 44.

The organic light emitting materials of different colors may be alternatively dropped on each of the corresponding second openings 44. The organic light emitting materials of different colors may include organic light emitting materials emitting red R, green G, and blue B, and if necessary, the organic light emitting materials emitting white W may be further included.

The second bank 43 is positioned between the first electrodes 30 neighboring in the first direction, thereby, the organic light emitting materials of different colors respectively dropped in the second openings 44 neighboring in the first direction are not mixed with each other. That is, the organic light emitting materials of different colors respectively dropped in the different second openings 44 are physically separated by the second bank 43.

The organic light emitting material, used to form the organic light emitting layer 50 during the solution process, is dropped so as to cover at least a portion of the first electrode 30, a portion of the first bank 41, and a portion of the second bank 43. The first bank 41 is a thin film of a hydrophilic element provided to suppress defects in wettability due to the hydrophobic characteristics of the first electrode 30, and can spread the hydrophilic organic light emitting material efficiently. The second bank 43 is a thick film with a hydrophobic characteristic, and allows the hydrophilic organic light emitting material to be pushed out to the center. Due to the combination structure of the first bank 41 and the second bank 43, the organic light emitting layer 50 may be formed in a relatively uniform thickness on the light emitting region.

In addition, when each of the second openings 44 expose one first electrode 30, the thickness of the organic light emitting material dropped in each of the second openings 44 can be different due to the equipment variation during the solution process. The equipment variation may mean a variation in discharge amount between nozzles of the inkjet equipment. That is, each of the nozzles used to drop the organic light emitting material on the second openings 44 may not have a constant discharge amount. In this case, the thickness of the organic light emitting material dropped on each the sub-pixel SP may be different depending on the position, through nozzles allocated one per sub-pixel SP.

According to the present disclosure, in one second opening 44, a plurality of sub-pixels SP may be allocated, and a plurality of nozzles corresponding to the number of sub-pixels SP may be allocated, therefore, the variation in the discharge amount between the nozzles can be compensated so that the thickness between the organic light emitting materials dropped in the second openings 44 can be made uniform.

Accordingly, the organic light emitting display device according to the present disclosure can suppress the reduction in uniformity of the organic light emitting layer 50, and can suppress the degradation of the display quality due to the variation in the thickness of the organic light emitting layer 50 in the sub-pixel SP. In addition, by ensuring the uniformity of the organic light emitting layer 50, it is possible to suppress a defect in which the life-time of the device is reduced or a dark spot occurs.

The predetermined interval between the above-described boundary of the first bank 41 and the boundary of the second bank 43 means a minimum distance capable of securing the thickness uniformity of the organic light emitting layer 50. Problems may occur when the boundary of the first bank 41 and the boundary of the second bank 43 are located closer than a predetermined interval, uniformity of the organic light emitting layer 50 cannot be secured or when the boundary of the first bank 41 and the boundary of the second bank 43 are located farther than a predetermined interval, the area of the first electrode 30 shielded by the first bank 41 increases and the aperture ratio decreases.

In the organic light emitting display device according to the present disclosure, since the second opening 44 of the second bank 43 extends along the second direction, the second bank 43 is not located between the neighboring sub-pixels SP in the second direction.

Therefore, in the present disclosure, since the above-described positional constraints of the first bank 41 are relatively reduced, it is possible to not only improve the degree of freedom in design, but also to secure the light emitting region on the first electrode 30 widely. Accordingly, the present disclosure can provide an organic light emitting display device having improved design freedom and securing a sufficient aperture ratio.

In addition, in case of the high-resolution display device, the area of the sub-pixels SP is relatively reduced. In this case, as the organic light emitting material may not be dropped in the right position, a mixed color defect in which the organic light emitting layers 50 of different colors are mixed with each other may occur. The present disclosure has an advantage of improving color mixing defects because the dropping area of the organic light emitting material can be sufficiently secured on the large second opening 44 corresponding to the plurality of sub-pixels SP.

Figure 6:
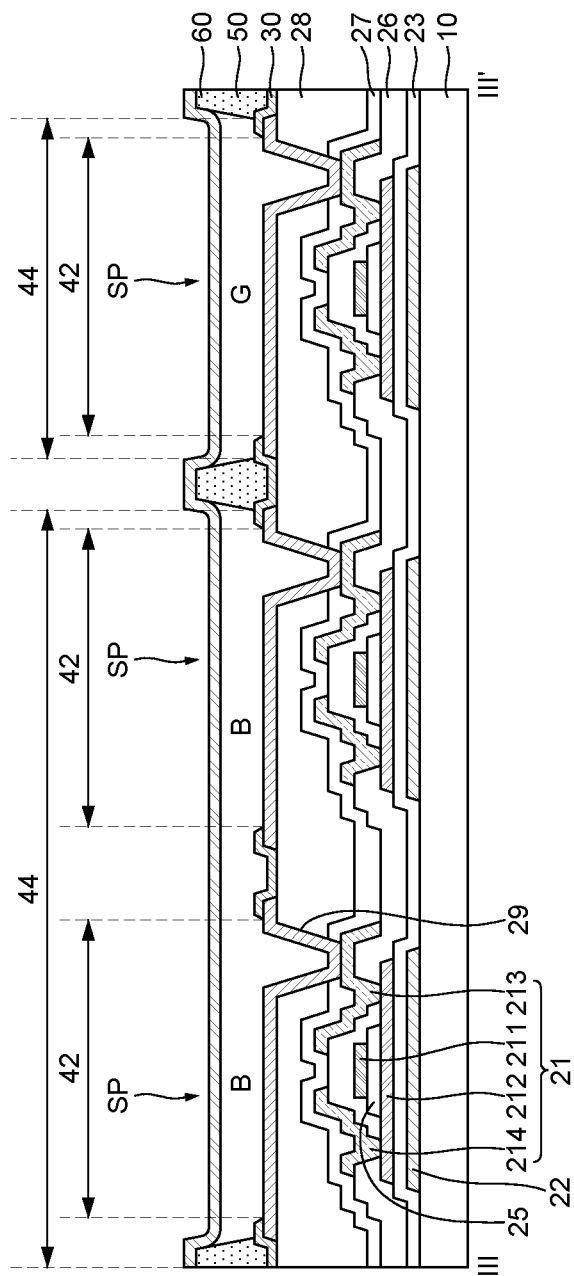
FIG. 6 is a cross-sectional view taken along lines of FIG. 4 according to one embodiment.

FIG. 6 is a cross-sectional view taken along lines of FIG. 4.

Referring to FIG. 6, on the substrate 10, an organic light emitting diode disposed on the circuit element layer is disposed. The circuit element layer may include a thin film transistor 21 electrically connected to an organic light emitting diode. For example, the light blocking layer 22 is positioned on the substrate 10. The light blocking layer 22 blocks external light from entering so as to suppress photocurrent occurring in the thin film transistor 21. The buffer layer 23 is positioned on the light blocking layer 22. The buffer layer 23 serves to protect the transistor formed in a subsequent process from impurities such as alkali-ions flowing out of the light blocking layer 22. The buffer layer 23 may be silicon oxide SiOx, silicon nitride SiNx, or multiple layers thereof.

The semiconductor layer 212 of the thin film transistor 21 is positioned on the buffer layer 23. The semiconductor layer 212 may be formed of a silicon semiconductor or an oxide semiconductor. The silicon semiconductor may include amorphous silicon or crystallized polycrystalline silicon. The semiconductor layer 212 includes a drain region and a source region including p-type or n-type impurities, and a channel therebetween.

A gate insulating layer 25 is positioned on the semiconductor layer 212. The gate insulating layer 25 may be silicon oxide SiOx, silicon nitride SiNx, or multiple layers thereof. The gate electrode 211 is positioned on the gate insulating layer 25 in a predetermined region of the semiconductor layer 212, that is, a position corresponding to a channel. The gate electrode 211 may be made of one among a group including molybdenum Mo, aluminum Al, chromium Cr, gold Au, titanium Ti, nickel Ni, neodymium Nd, or copper Cu, or alloys thereof. In addition, the gate electrode 211 may be a multi-layer made of one among a group including molybdenum Mo, aluminum Al, chromium Cr, gold Au, titanium Ti, nickel Ni, neodymium Nd, or copper Cu or alloys thereof. For example, the gate electrode 211 may be a double layer of molybdenum/aluminum-neodymium or molybdenum/aluminum.

An interlayer insulating layer 26 that insulates the gate electrode 211 is positioned on the gate electrode 211. The interlayer insulating layer 26 may be a silicon oxide SiOx layer, a silicon nitride SiNx layer, or multiple layers thereof. The source electrode 213 and the drain electrode 214 are positioned on the interlayer insulating layer 26. The source electrode 213 and the drain electrode 214 are connected to the semiconductor layer 212 through a contact hole exposing the source region of the semiconductor layer 212. The source electrode 213 and the drain electrode 214 may be formed of a single layer or multiple layers, and when the source electrode 213 and the drain electrode 214 are single layers, they can be made of one among a group including molybdenum Mo, aluminum Al, chromium Cr, gold Au, titanium Ti, nickel Ni, neodymium Nd, or copper Cu, or alloys thereof. In addition, when the source electrode 213 and the drain electrode 214 are multi layered, it can be made of a double layer of molybdenum/aluminum-neodymium, a triple layer of titanium/aluminum/titanium, molybdenum/aluminum/molybdenum, or molybdenum/aluminum-neodymium/molybdenum. Accordingly, the thin film transistor 21 including the semiconductor layer 212, the gate electrode 211, the source electrode 213, and the drain electrode 214 is configured.

The passivation layer 27 is positioned on the substrate 10 including the thin film transistor 21. The passivation layer 27 is an insulating layer that protects the underlying element, and may be a silicon oxide SiOx layer, a silicon nitride SiNx layer, or multiple layers thereof. The overcoat layer 28 is positioned on the passivation layer 27. The overcoat layer 28 may be a flattening film for alleviating the step difference of the lower structure, and is made of organic materials such as polyimide, benzocyclobutene series resin, or acrylate. A sub-pixel contact hole 29 exposing the passivation layer 27 to expose the source electrode 213 is positioned in a portion of the overcoat layer 28.

An organic light emitting diode is formed on the overcoat layer 28. The organic light emitting diode includes the first electrode 30 connected to the thin film transistor, the second electrode 60 facing the first electrode 30, and the organic light emitting layer 50 interposed between first electrode 30 and the second electrode 60. The first electrode 30 may be an anode electrode, and the second electrode 60 may be a cathode electrode.

The first electrode 30 is positioned on the overcoat layer 28 and may be connected to the source electrode 213 of the transistor through the sub-pixel contact hole 29 passing through the overcoat layer 28. The first electrode 30 may be allocated one per sub-pixel, but is not limited thereto. The first electrode 30 is made of a transparent conductive material such as Indium-Tin-Oxide ITO, Indium-Zinc-Oxide IZO, or Zinc-Oxide ZnO in response to the applied light emission method, and can function as a transparent electrode. In addition, a reflective layer function as a reflective electrode may be included. The reflective layer may be made of aluminum Al, copper Cu, silver Ag, nickel Ni, or alloys thereof, preferably silver/palladium/copper APC alloy.

The bank 40 is disposed on the substrate 10 on which the first electrode 30 is formed. The bank 40 includes a first bank 41 and a second bank 43. The first bank 41 and the second bank 43 each include an opening exposing most of the first electrode 30.

The organic light emitting layer 50 is disposed on the substrate 10 on which the bank 40 is formed. The organic light emitting layer 50 includes an emission layer EML and may further include at least one among a hole injection layer HIL, a hole transport layer HTL, an electron transport layer ETL, and an electron injection layer EIL. The bank 40 includes a first bank 41 and a second bank 43.

The first bank 41 includes a first opening 42 exposing a plurality of first electrodes 30 arranged in a row direction. The second bank 43 includes a second opening 44 exposing a plurality of first electrodes 30 arranged in a column direction.

The second electrode 60 is disposed on the organic light emitting layer 50. The second electrode 60 may be formed wide on the front surface of the substrate 10. The second electrode 60 may function as a transparent electrode or a reflective electrode in correspondence to the adopted light emission method. When the second electrode 60 is a transparent electrode, the second electrode 60 may be formed of a transparent conductive material such as Indium-Tin-Oxide ITO or Indium-Zinc-Oxide IZO. It may be made of magnesium Mg, calcium Ca, aluminum Al, silver Ag, or an alloy thereof having a thin thickness that is thin enough to transmit light.

Figure 7A:
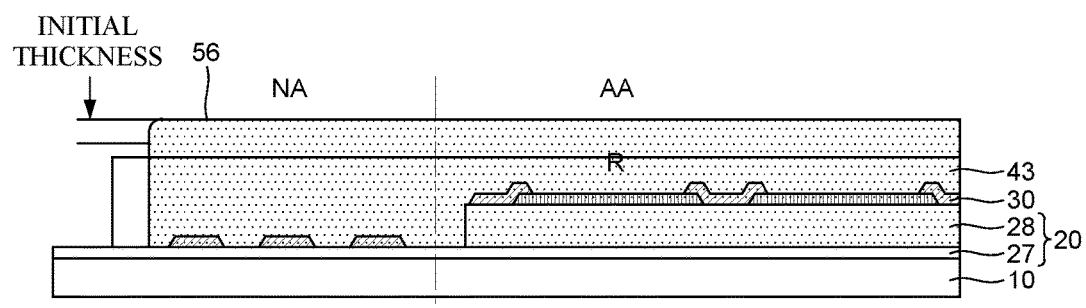
FIGS. 7A to 7C are views for explaining a liquid curling phenomenon at the edge according to one embodiment.
Figure 7B:
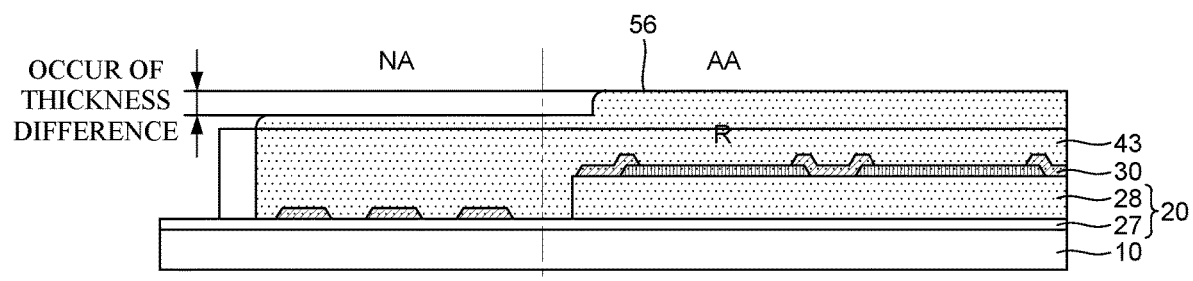
Figure 7C:
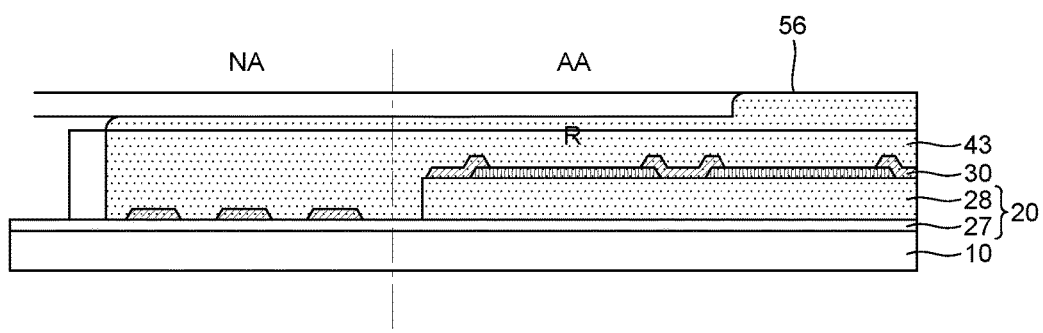

FIGS. 7A to 7C are views for explaining a liquid curling phenomenon at the edge.

Referring to FIG. 7A to 7C, when the organic light emitting material 56 is dropped on the substrate 10, the organic light emitting material 56 is dropped in the second opening 44 of the second bank 43 partitioned in the display area AA and the non-display area NA. In the initial stage of dropping, the organic light emitting material 56 is formed in a uniform thickness in the display area AA and the non-display area NA as shown in FIG. 7A.

When the organic light emitting material 56 is dried, the non-display area NA around the display area AA of the substrate 10 has a lower vapor pressure than the center of the display area AA, so that the natural drying is rapidly performed. At this time, the thickness of the organic light emitting material 56 increases as it moves toward the center of the display area AA due to cohesion of the liquid and convection of the surrounding vapor pressure as shown in FIG. 7B.

In other words, when the organic light emitting material 56 is dried, the organic light emitting material 56 quickly dries out of the display area AA and agglomerates to the center of the display area as shown in FIG. 7C. Accordingly, an edge curling phenomenon in which the amount of the organic light emitting material 56 is reduced in the non-display area NA outside the display area AA may occur.

Therefore, due to the phenomenon of agglomeration of the organic light emitting material 56 to the central portion of the display area AA of the second opening 44, the thickness of the organic light emitting layer formed after drying is not uniform depending on the position, a defect may occur in which the thickness of the organic light emitting layer is thick in the central portion where the organic light emitting material is agglomerated and the thickness of the organic light emitting layer is thin in the outer portion. This appears to the user as a difference in luminance between the outer portion and the central portion, which causes a problem that the display quality is deteriorated.

The Second Embodiment

Figure 8:
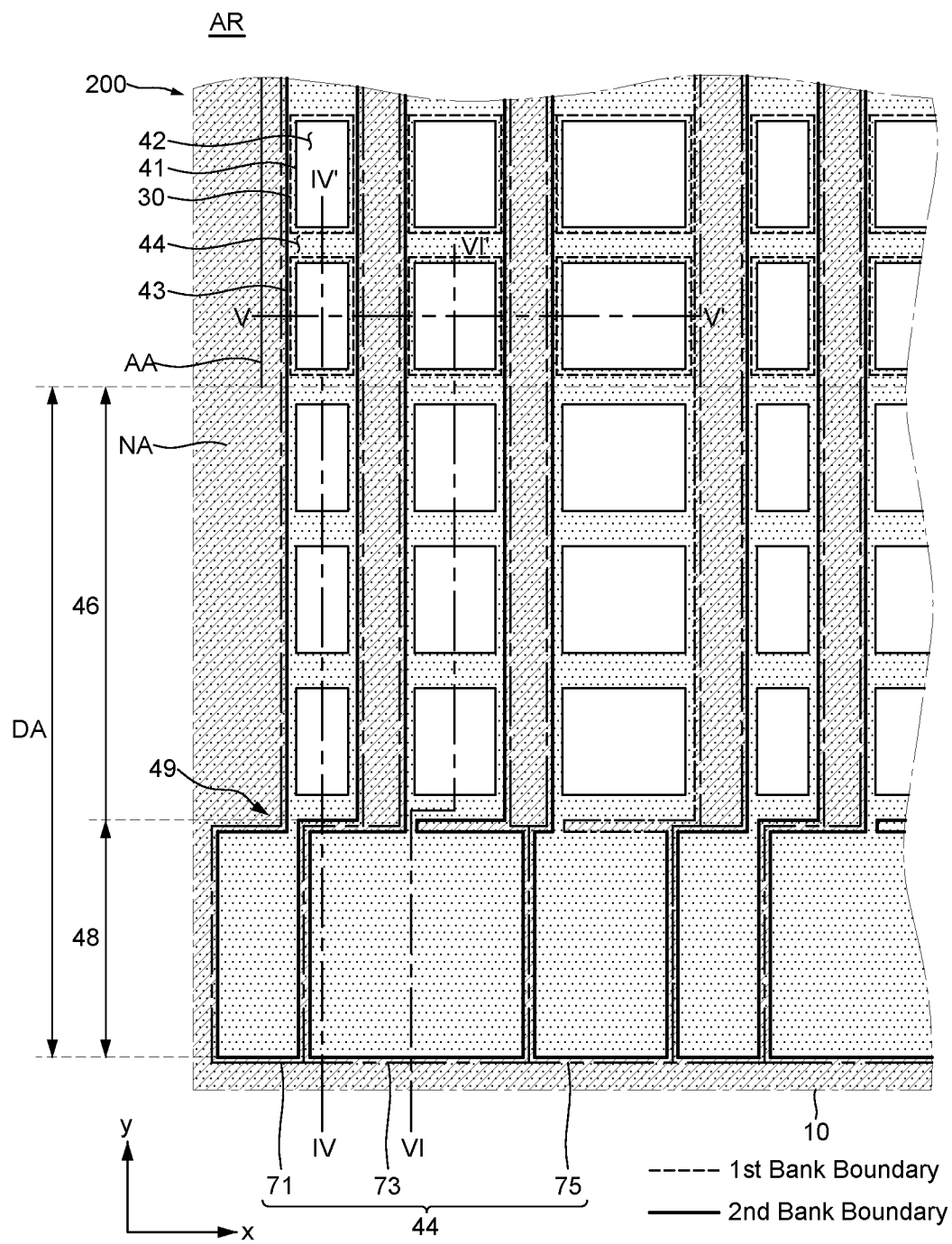
FIG. 8 is a plan view schematically showing an organic light emitting display device according to a second embodiment of the present disclosure.
Figure 9A:
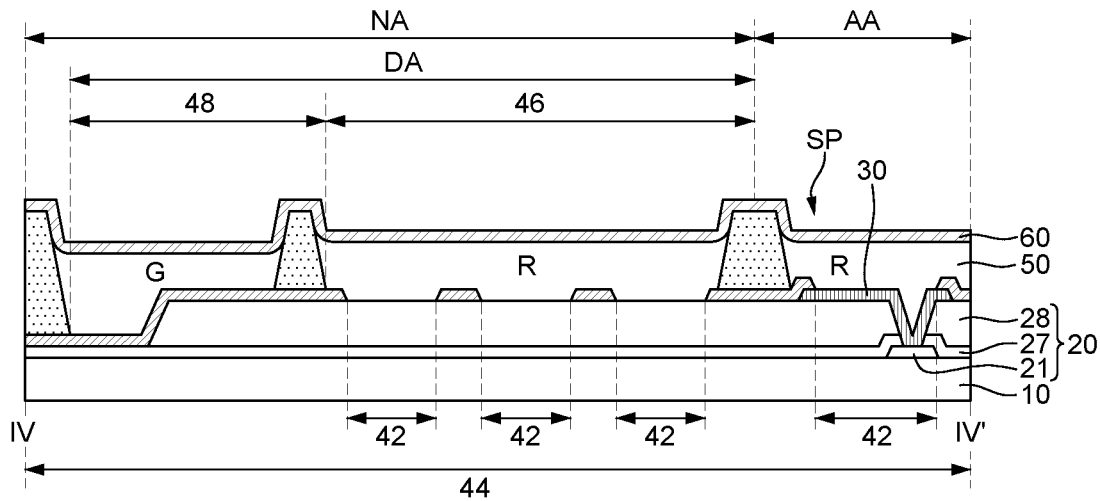
FIG. 9A is a cross-sectional view taken along lines IV-IV' of FIG. 8.
Figure 9B:
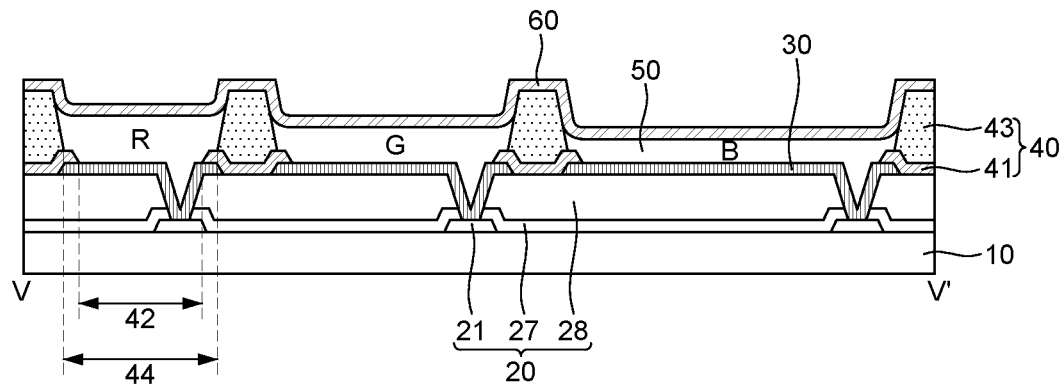
FIG. 9B is a cross-sectional view taken along lines V-V' of FIG. 8
Figure 9C:
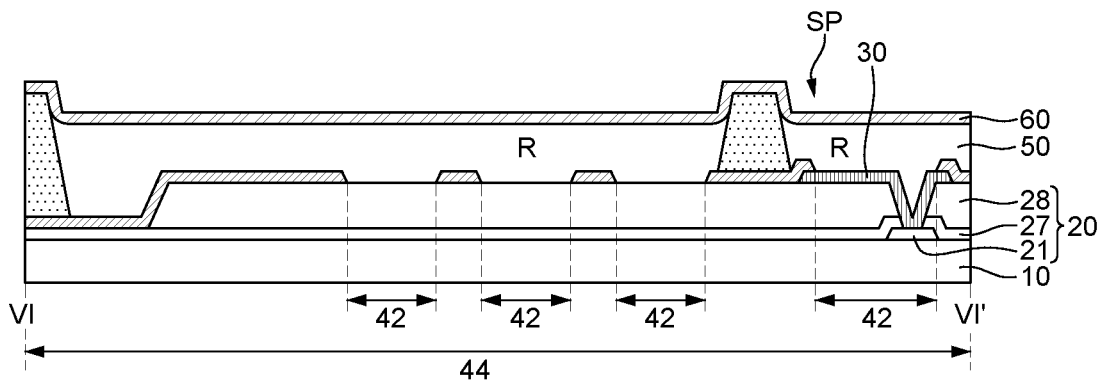
FIG. 9C is a cross-sectional view taken along lines VI-VI' of FIG. 8 according to one embodiment.
Figure 10A:
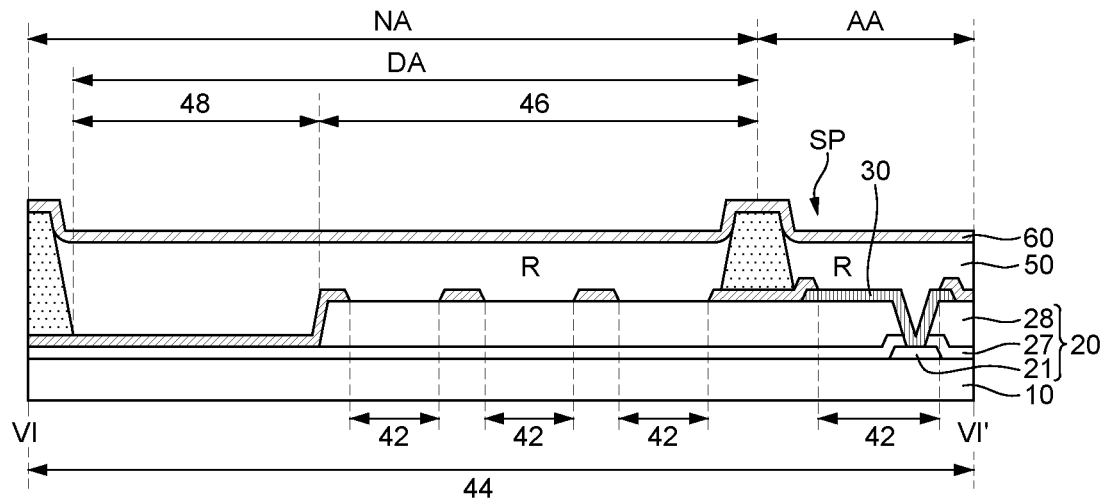
FIGS. 10A and 10B are cross-sectional views showing another example taken along line VI-VI' of FIG. 8 according to one embodiment.
Figure 10B:
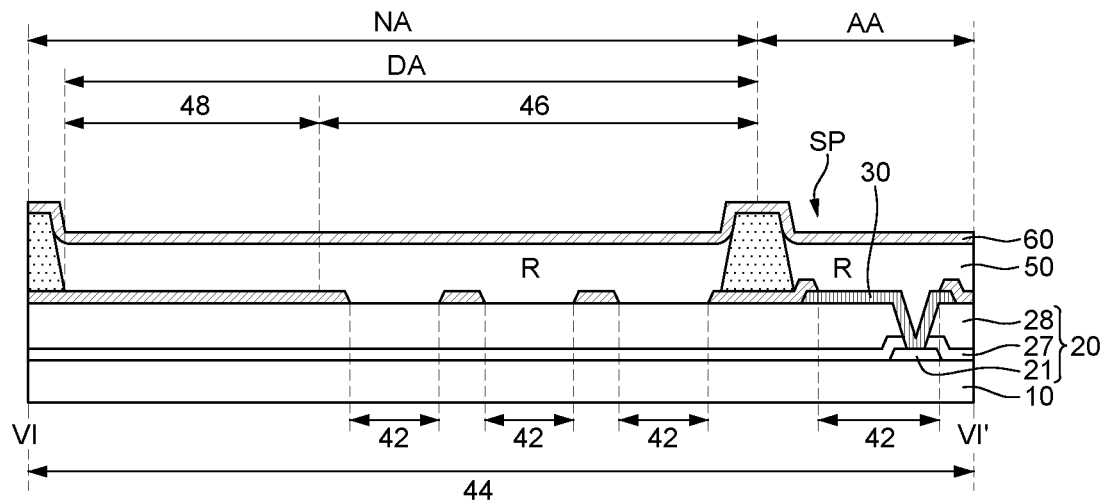
Figure 11:
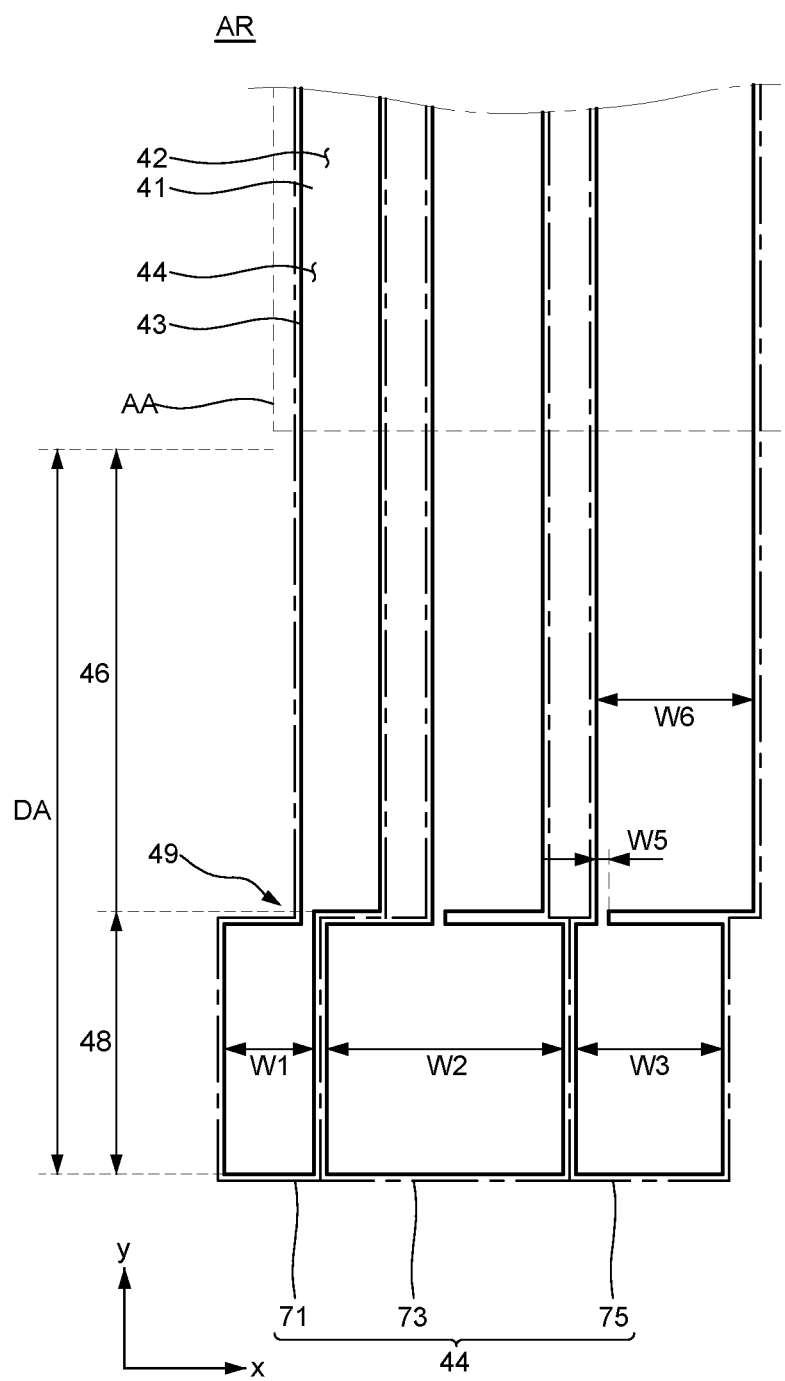
FIG. 11 is a plan view showing a second opening of the organic light emitting display device according to the second embodiment of the present disclosure.

FIG. 8 schematically illustrates an organic light emitting display device according to a second embodiment of the present disclosure, and is an enlarged plan view of an AR area of FIG. 1. FIG. 9A is a cross-sectional view taken along lines IV-IV' of FIG. 8, FIG. 9B is a cross-sectional view taken along lines V-V' of FIG. 8 and FIG. 9C is a cross-sectional view taken along lines VI-VI' of FIG. 8. FIGS. 10A and 10B are cross-sectional views showing another example taken along line VI-VI' of FIG. 8. FIG. 11 is a plan view showing a second opening of the organic light emitting display device according to the second embodiment of the present disclosure.

Referring to FIGS. 8 and 9A to 9C, the organic light emitting display device 100 according to the second embodiment of the present disclosure includes a substrate 10 including a display area AA in which sub-pixels SP are arranged and a non-display area NA disposed outside the display area AA. The substrate 10 may have various planar shapes. For example, as shown in the drawing, it may include any kind of planar shapes such as a square, a circle, and an oval as well as a rectangle. In the substrate 10, a first direction, for example, X-axis direction and a second direction, for example, Y-axis direction intersecting each other may be defined regardless of the planar shape of the substrate 10. Positions and arrangement relationships of sub-pixels and/or openings, which will be described later, may be defined by the first direction and the second direction.

On the substrate 10, the circuit element layer 20 and the organic light emitting diode driven by the elements provided in the circuit element layer 20 are disposed.

In the circuit element layer 20, signal lines and electrodes for applying a driving signal to the organic light emitting diode may be arranged, and the signal lines and the electrodes may be separated with at least one insulating layer therebetween as necessary. When the organic light emitting display device is implemented in an active matrix AM method, the circuit element layer 20 may further include a thin film transistor 21 allocated for each sub-pixel SP. Hereinafter, for convenience of description, a case where a thin film transistor 21 is allocated for each sub-pixel will be described as an example. At this time, the passivation layer 27 and the overcoat layer 28 are interposed between the thin film transistor 21 and the organic light emitting diode. The passivation layer 27 includes an inorganic material and protects the internal element. The overcoat layer 28 includes a certain organic material, and is formed to have a predetermined thickness to compensate for a step difference caused by the thin film transistor 21 and signal lines formed thereunder.

As illustrated in FIG. 9A, the overcoat layer 28 may be disposed in the display area AA and the non-display area NA. That is, the overcoat layer 28 may be continuously disposed over the entire display area AA and the non-display area NA.

The organic light emitting diode includes a first electrode 30, a second electrode 60, and an organic light emitting layer 50 interposed between the first electrode 30 and the second electrode 60. The first electrode 30 may be an anode, and the second electrode 60 may be a cathode.

More specifically, the sub-pixels SP may be arranged along a first direction and a second direction intersecting each other. Sub-pixels SP arranged adjacent to the first direction may emit light of different colors, and the sub-pixels SP arranged adjacent to the second direction may emit light of the same color. In the sub-pixels SP, the first electrode 30 of the organic light emitting diode is disposed. The first electrode 30 may be assigned to each of the sub-pixels SP.

On the first electrode 30, the bank 40 is disposed. The bank 40 includes a first bank 41 and a second bank 43.

The first bank 41 is positioned on the first electrode 30. The first bank 41 includes a first opening 42 exposing at least a portion of the first electrode 30. One first opening 42 exposes one first electrode 30. Therefore, the number of the first openings 42 and the number of the first electrodes 30 may correspond to each other.

The first bank 41 may be formed with a relatively thin thickness so that it can be covered by the organic light emitting layer 50. The first bank 41 may have hydrophilic properties. For example, the first bank 41 may be formed of a hydrophilic inorganic insulating material such as silicon oxide SiOx or silicon nitride SiNx.

The first bank 41 is formed over the entire display area AA and the non-display area NA. The first opening 42 of the first bank 41 is formed in the display area AA and the non-display area NA. In the display area AA, the first opening 42 exposes the first electrode 30, and in the non-display area NA, the first opening 42 exposes the overcoat layer 28 disposed thereunder.

In the drawing, the case where the first opening 42 having an approximately rectangular shape is illustrated as an example, but is not limited thereto. In addition, although the first openings 42 are all illustrated to have the same shape and area, the present disclosure is not limited thereto, and at least one of the first openings 42 may have different shape and/or area from the other first opening 42. For example, the shape and/or area of the first opening 42 may be appropriately selected in consideration of the life-time of the organic light emitting material for forming the organic light emitting layer 50 of the organic light emitting diode. A portion of the first electrode 30 exposed by the first opening 42 may be defined as a light emitting region.

The non-display area NA may further include a dummy area DA. The dummy area DA is an area adjacent to the second direction from the display area AA. The first bank 41 is disposed in the display area AA and extends to the dummy area DA. In the dummy area DA, an overcoat layer 28 is interposed between the first bank 41 and the substrate 10.

On the substrate 10 on which the first bank 41 is formed, the second bank 43 is located. The second bank 43 includes a second opening 44 exposing at least a portion of the first electrode 30. The plurality of second openings 44 are arranged side by side in the first direction, and each extends in the second direction. The second opening 44 extends in the second direction to expose a plurality of first electrodes 30 disposed along the second direction. Alternatively, the second opening 44 extends in the second direction to expose a plurality of first openings 42 disposed along the second direction.

The second bank 43 may have hydrophobic characteristics. For example, the second bank 43 may have a form in which a material having a hydrophobic property is coated on the insulating material, and may be formed of an insulating material containing a hydrophobic material. The second bank 43 may be made of an organic material. The hydrophobic property of the second bank 43 may serve to hold the organic light emitting material constituting the organic light emitting layer 50 so as not to be gathered in the center of the light emitting region. In addition, the second bank 43 may function as a barrier that traps the organic light emitting material dropped in the corresponding region so as to suppress the organic light emitting materials of different colors from being mixed with each other.

In the drawings, the case where the second opening 44 has an approximately rectangular shape is illustrated as an example, but is not limited thereto. In addition, although the second openings 44 are all illustrated to have the same shape and area, the present disclosure is not limited thereto, and at least one second opening 44 may have different shape and/or area from the other second opening 44. For example, the shape and/or area of the second opening 44 may be appropriately selected in consideration of the life-time of the organic light emitting material.

The second opening 44 is spaced apart from the first opening 42. That is, the boundary of the first bank 41 is separated from the boundary of the second bank 43 by a predetermined interval. Accordingly, the first opening 42 may be exposed by the second opening 44. The second bank 43 is disposed in the display area AA, and the second opening 44 exposes a plurality of first electrodes 30 arranged in the display area AA.

The second bank 43 includes a first dummy opening 46 disposed in the non-display area NA. The first dummy opening 46 is formed in the dummy area DA of the non-display area NA to expose the first bank 41 disposed in the dummy area DA. The dummy area DA is a non-display area NA in which a thin film transistor and an organic light emitting diode are not disposed. Accordingly, the first dummy opening 46 exposes the first bank 41 and the overcoat layer 28 exposed by the first opening 42 of the first bank 41 in the dummy area DA. The first dummy opening 46 is disposed to extend in the same second direction as the direction in which the second opening 44 is extended.

Meanwhile, the second bank 43 includes a second dummy opening 48 extending from the first dummy opening 46. The second dummy opening 48 extends from the first dummy opening 46 and extends in the second direction. The second dummy opening 48 is disposed adjacent to the outside of the substrate 10 and is disposed in the display area AA in the order of the first dummy opening 46 and the second dummy opening 48 in the outward direction of the substrate 10.

The organic light emitting layer 50 is positioned on the substrate 10 on which the second bank 43 is formed. The organic light emitting layer 50 may be formed along the corresponding second opening 44. That is, the organic light emitting material dropped on the second opening 44 covers the first electrodes 30 and the first banks 41 exposed by the second opening 44, and is not physically separated by the first bank 41. Further, the organic light emitting material dropped on the first dummy opening 46 and the second dummy opening 48 covers the first bank 41 and the overcoat layer 28 disposed thereunder and is not physically separated by the first bank 41.

On the plurality of first electrodes 30 exposed by the second opening 44, an organic light emitting material of the same color is dropped. This means that light of the same color is emitted from a plurality of sub-pixels SP allocated to a position corresponding to one second opening 44. In addition, the first dummy opening 46 extending in the same direction as the second opening 44 is also loaded with the organic light emitting material of the same color, and the second dummy opening 48 extending from the first dummy opening 46 is also loaded with the organic light emitting material of the same color. The planar shape of the organic light emitting layer 50 may correspond to the planar shape of the second opening 44.

The organic light emitting materials having different colors may be sequentially and alternately dropped on the corresponding second opening 44, first dummy opening 46, and second dummy opening 48, respectively. The organic light emitting materials of different colors may include organic light emitting materials emitting red R light, green G light, and blue B light, and if necessary, the organic light emitting materials emitting white W light may be further included.

The second bank 43 is positioned between the first electrodes 30 neighboring in the first direction, and the second opening 44, the first dummy opening 46, and thus, the organic light emitting materials of different colors respectively dropped in the second opening 44, the first dummy opening 46, and the second dummy opening 48 neighboring in the first direction are not mixed with each other. That is, the organic light emitting materials of different colors respectively dropped in the different second openings 44, the first dummy openings 46, and the second dummy openings 48 are physically separated by the second bank 43.

As described above, in the second embodiment of the present disclosure, the second opening 44 of the dummy area DA may include the first dummy opening 46 and the second dummy opening 48.

Specifically, the second openings 44 of the second bank 43 include a first column 71, a second column 73, and a third column 75 including different organic light emitting layers 50 as shown in FIG. 8.

The first column 71 is an area in which the organic light emitting layer 50 having any one color is formed in the second opening 44 arranged in the second direction. The second column 73 is an area, adjacently spaced apart from the first column 71, where an organic light emitting layer 50 having a different color from the organic light emitting layer 50 formed in the first column 71 is formed. The third column 75 is an area, adjacently spaced apart from the first column 71, where an organic light emitting layer 50 having a different color from the organic light emitting layers 50 formed in the first column 71 and the second column 73 is formed.

In each of the first column 71, the second column 73, and the third column 75, the second bank 43 includes a first dummy opening 46 disposed in the dummy area DA of the non-display area NA and a second dummy opening 48 extending from the first dummy opening 46.

The first dummy opening 46 and the second dummy opening 48 may be divided according to whether or not the first opening 42 of the first bank 41 overlaps. The first dummy opening 46 corresponds to an area overlapping the first opening 42 of the first bank 41, and the second dummy opening 48 corresponds to an area non-overlapping the first opening 42 of the first bank 41. In addition, the second dummy opening 48 may be defined as an area from a region where the bottleneck part 49 of the second dummy opening 48 starts to an end adjacent to the outside of the substrate 10. Here, the bottleneck part 49 of the second dummy opening 48 may be defined as an area having a width narrower than the width of the first dummy opening 46 at the end of the first dummy opening 46.

As described in the above-described first embodiment, when the organic light emitting material is dried after dropping, the organic light emitting material quickly dries in the outer portion of the display area AA and agglomerates to the central portion of the display area AA, so that the thickness of the organic light emitting layer is formed non-uniformly.

In the second embodiment of the present disclosure, in the non-display area NA other than the display area AA, the dummy area DA is provided and the first dummy opening 46 and the second dummy opening 48 of the second opening 44 disposed in the dummy area DA may be provided. The first dummy opening 46 and the second dummy opening 48 store the dropped organic light emitting material.

The organic light emitting material stored in the first dummy opening 46 and the second dummy opening 48 may be filled in the second opening 44 of the display area AA, and the movement of the organic light emitting material may be reduced to the display area AA.

For example, when the organic light emitting material dropped on the second opening 44 disposed at the edge portion of the display area AA is rapidly dried and agglomerates to the central portion, the second opening 44 disposed on the edge of the display area AA is filled with the organic light emitting material dropped on the first dummy opening 46 and the second dummy opening 48 disposed in the dummy area DA. That is, since the organic light emitting material is continuously supplied to the second opening 44 disposed in the edge portion of the display area AA, the amount of the organic light emitting material in the second opening 44 disposed in the edge portion can be maintained. Accordingly, since the thickness of the organic light emitting layer formed after drying the organic light emitting material may be uniformly formed in the edge portion and the center portion of the display area AA, luminance uniformity can be improved, and the display quality can be improved.

To this end, as shown in FIGS. 9A to 9C, the second dummy opening 48 may be formed with at least a portion of the overcoat layer 28 at the bottom to increase the amount of the organic light emitting material that can be filled in the second dummy opening 48.

In addition, as illustrated in FIGS. 10A and 10B, the overcoat layer 28 may be removed from the entire second dummy opening 48 to further increase the amount of the organic light emitting material that can be filled in the second dummy opening 48. However, the present disclosure is not limited thereto, and similar effects may be provided even when the overcoat layer 28 is entirely formed in the second dummy opening 48. In addition, the overcoat layer 28 may be formed entirely or partially in any one of the first to third columns 71, 73, and 75, or may be formed in one column and not in another column.

Referring to FIGS. 8 and 11, the first dummy opening 46 of the present disclosure has a shape extending to the non-display area NA in the same manner as the shape of the second opening 44 of the display area AA. The second dummy opening 48 extends in the same direction as the first dummy opening 46 but has a different planar shape. The second dummy opening 48 extends on one side of the first dummy opening 46, but is bent and protrudes into adjacent column. For example, the second dummy opening 48 of the first column 71 is disposed to protrude to the non-display area NA of the substrate 10. The second dummy opening 48 of the second column 73 is disposed to protrude to the adjacent first column 71 and third column 75. The second dummy opening 48 of the third column 75 is disposed to protrude to the adjacent third column 75.

The second dummy openings 48 disposed in each of the first to third columns 71, 73, and 75 may have different planar areas. For example, a red light emitting layer is formed in the second opening 44 formed in the first column 71, a green light emitting layer is formed in the second opening 44 formed in the second column 73, and a blue light emitting layer is formed in the second opening 44 formed in the third column 75. Differences in the planar area of the second dummy openings 48 formed in the first to third columns 71, 73, and 75, respectively, may be adjusted according to light emission characteristics of each light emitting layer.

In the second opening 44 of the first column 71 in which the red light emitting layer having the narrowest width is formed, a large amount of red organic light emitting material is dropped compared to the surface area, so that the degree of curling of the edge portion is relatively small. Accordingly, by making the second dummy opening 48 of the first column 71 in which the red light emitting layer is formed has the smallest planar area, the amount of the organic light emitting material moving in the second dummy opening 48 is small, so that the amount of the organic light emitting material filling the second opening 44 in the display area AA is small.

In addition, in the second opening 44 of the second column 73 in which the green light emitting layer is formed having a width greater than that of the second opening 44 in the first column 71 in which the red light emitting layer is formed, a relatively small amount of the green organic light emitting material is dropped compared to the surface area, so that relatively more liquid curling phenomenon at the edge is occurred. Therefore, the second dummy opening 48 of the second column 73 in which the green light emitting layer is formed is formed to be larger than the second dummy opening 48 of the first column 71, so that the amount of the organic light emitting material moving from the second dummy opening 48 is increased to increase the amount of the organic light emitting material filled in the second opening 44 of the display area AA.

In addition, in the second opening 44 of the third column 75 in which the blue light emitting layer is formed having a width greater than that of the second opening 44 in the second column 73 in which the green light emitting layer is formed, a relatively small amount of the blue organic light emitting material is dropped compared to the surface area, so that relatively more liquid curling phenomenon at the edge is occurred. However, the visibility of the liquid curling phenomenon of blue is relatively inferior to that of green. Therefore, the second dummy opening 48 of the third column 75 in which the blue light emitting layer is formed is formed to have smaller planar area than the second dummy opening 48 of the second column 73 and is formed to have larger planar area than the second dummy opening 48 of the first column 71, so that the amount of the organic light emitting material moving from the second dummy opening 48 is adjusted to control the amount of the organic light emitting material filled in the second opening 44 of the display area AA.

In the second embodiment of the present disclosure, by adjusting the planar area of the second dummy opening formed in each column in consideration of visibility of liquid curling phenomenon for each color emitted by the organic light emitting layer, a decrease in display quality due to variation in thickness of the organic light emitting layer according to the position can be remarkably improved.

As described above, the second dummy opening 48 of the present disclosure may have different planar areas in the first to third columns 71, 73, and 75. To this end, the widths of the second dummy openings 48 may be different from each other.

Specifically, referring to FIG. 11, the width W1 of the second dummy opening 48 disposed in the first column 71 may be narrower than the widths W2 and W3 of the second dummy openings 48 disposed in the second column 73 and the third column 75, respectively. In addition, the width W2 of the second dummy opening 48 disposed in the second column 73 may be wider than the widths W1 and W3 of the second dummy openings 48 disposed in the first column 71 and the third column 75, respectively. In addition, the width W3 of the second dummy opening 48 disposed in the third column 75 may be wider than the width W1 of the second dummy openings 48 disposed in the first column 71 and narrower than the width W2 of the second dummy opening 48 disposed in the second column 73. Accordingly, as described above, by adjusting the width of the second dummy openings formed in each column in consideration of visibility of liquid curling phenomenon for each color emitted by the organic light emitting layer, a decrease in display quality due to variation in thickness of the organic light emitting layer according to the position can be remarkably improved.

In addition, the width W5 of the bottleneck part 49 included in the second dummy opening 48 of the present disclosure may be made narrower than the width W6 of the first dummy opening 46. The width W5 of the bottleneck part 49 may be 20% to 40% of the width W6 of the first dummy opening 46. If the width W5 of the bottleneck part 49 is 20% or more compared to the width W6 of the first dummy opening 46, by moving the organic light emitting material filled in the first dummy opening 46 to the second dummy opening 48 by capillary phenomenon, the movement to the second opening 44 of the display area AA can be reduced. Therefore, it is possible to reduce the thickness variation of the organic light emitting layer according to the position by suppressing the liquid curling phenomenon of the edge portion of the display area AA. In addition, if the width W5 of the bottleneck part 49 is less than or equal to 40% of the width W6 of the first dummy opening 46, the width W5 of the bottleneck part 49 is increased, thereby suppressing the capillary phenomenon from occurring. The aforementioned FIG. 11 is merely an example of the first dummy opening 46 and the second dummy opening 48 of the second opening 44 arranged in the third column 75, but is not limited thereto, and this can be applied to the first column 71 and the second column 73 in the same manner.

In addition, sum W1+W2+W3 of the total widths W1, W2, and W3 of the second dummy openings 48 disposed in the first column 71 to the third column 75 may be equal to or smaller than the overall width of the second openings 44 arranged in the first column 71 to the third column 75 of the display area AA. Since the organic light emitting display device of the present disclosure is made of a structure in which the first column 71 to the third column 75 are repeatedly arranged on the substrate 10, when sum W1+W2+W3 of the total widths W1, W2, and W3 of the second dummy openings 48 arranged in the first column 71 to the third column 75 is larger than the overall width of the second openings 44 arranged in the first column 71 to the third column 75 of the display area AA, the second dummy opening 48 cannot be made with the same rules. Accordingly, sum W1+W2+W3 of the total widths W1, W2, and W3 of the second dummy openings 48 disposed in the first column 71 to the third column 75 needs to be equal to or smaller than the overall width of the second openings 44 arranged in the first column 71 to the third column 75 of the display area AA.

As described above, the organic light emitting display device 100 according to the first embodiment of the present disclosure, during the curing process of the organic light emitting material, the organic light emitting material may be gathered to the central portion of the display area, and the edge portion curling phenomenon in which the amount of the organic light emitting material is relatively reduced at the edge portion may occur. According to the organic light emitting display device 200 of the second embodiment of the present disclosure, by forming the first dummy opening and the second dummy opening in the dummy area DA of the non-display area NA, the organic light emitting material is held so that the organic light emitting material does not gather from the edge portion, that is, the dummy area DA, to the center of the display area AA. In addition, by generating a capillary phenomenon, the organic light emitting material may be formed in the dummy area DA to have a uniformed thickness. Therefore, there is an advantage that the degradation of the display quality due to the thickness variation problem of the organic light emitting layer 50 according to the position can be remarkably improved.

The Third Embodiment

Figure 12:
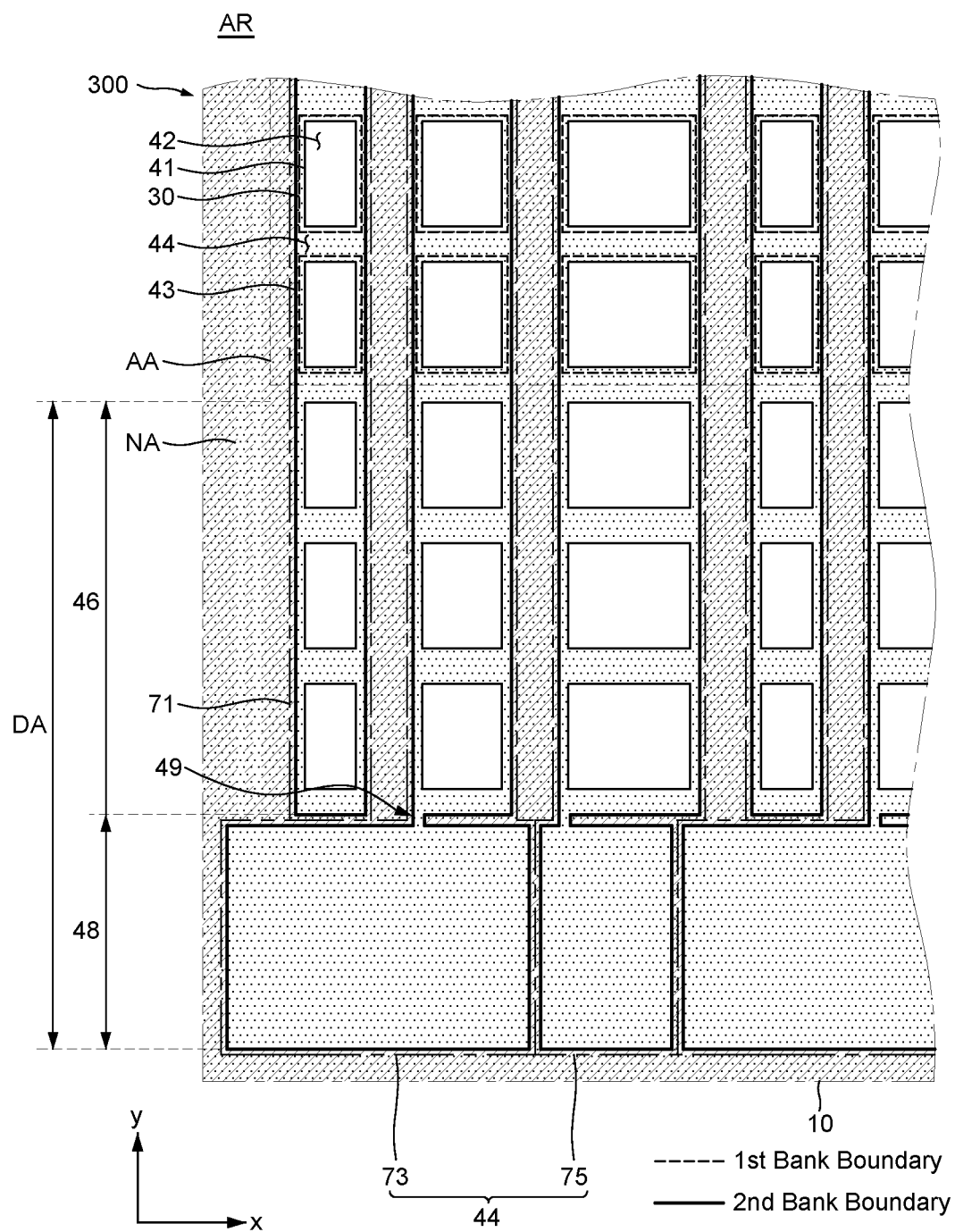
FIG. 12 is a plan view schematically showing an organic light emitting display device according to a third embodiment of the present disclosure.
Figure 13:
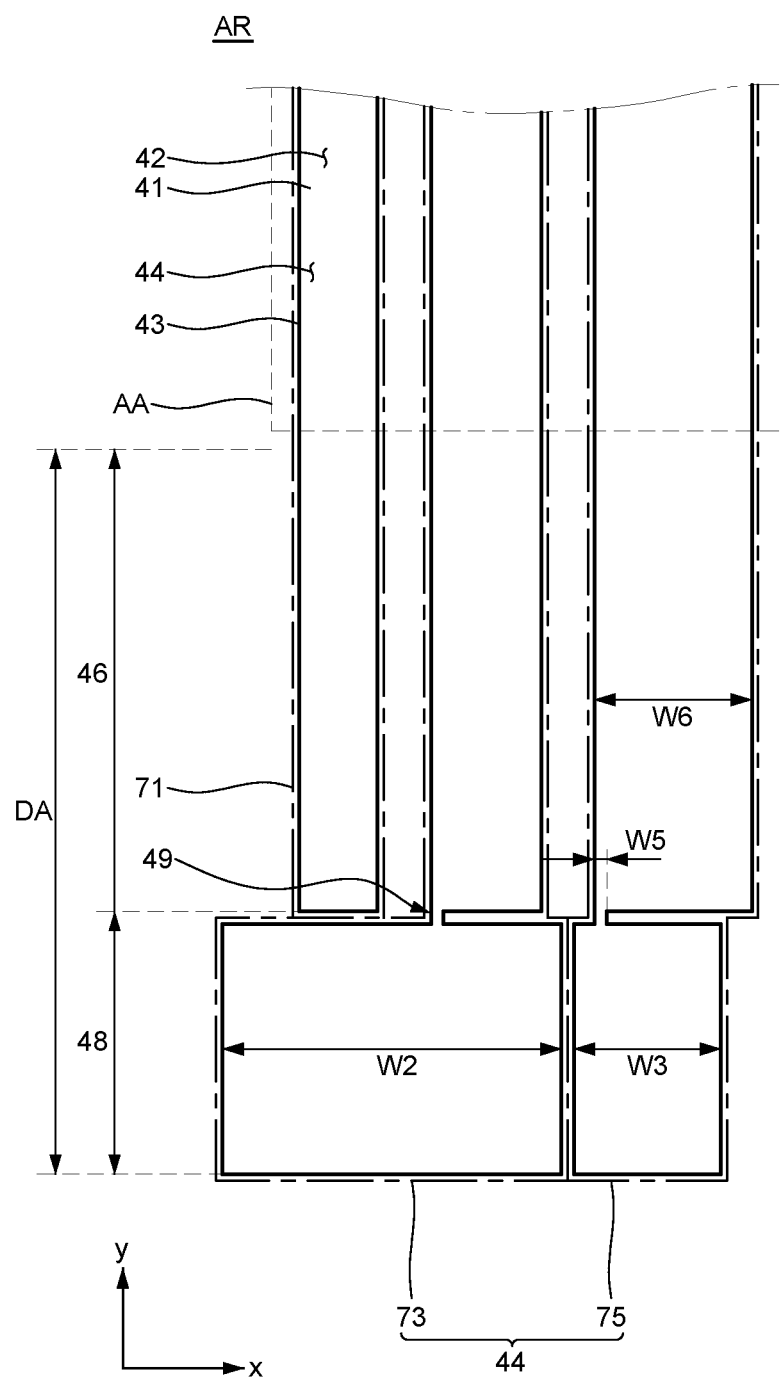
FIG. 13 is a plan view showing a planar shape of a second opening of an organic light emitting display device according to a third embodiment of the present disclosure.
Figure 14:
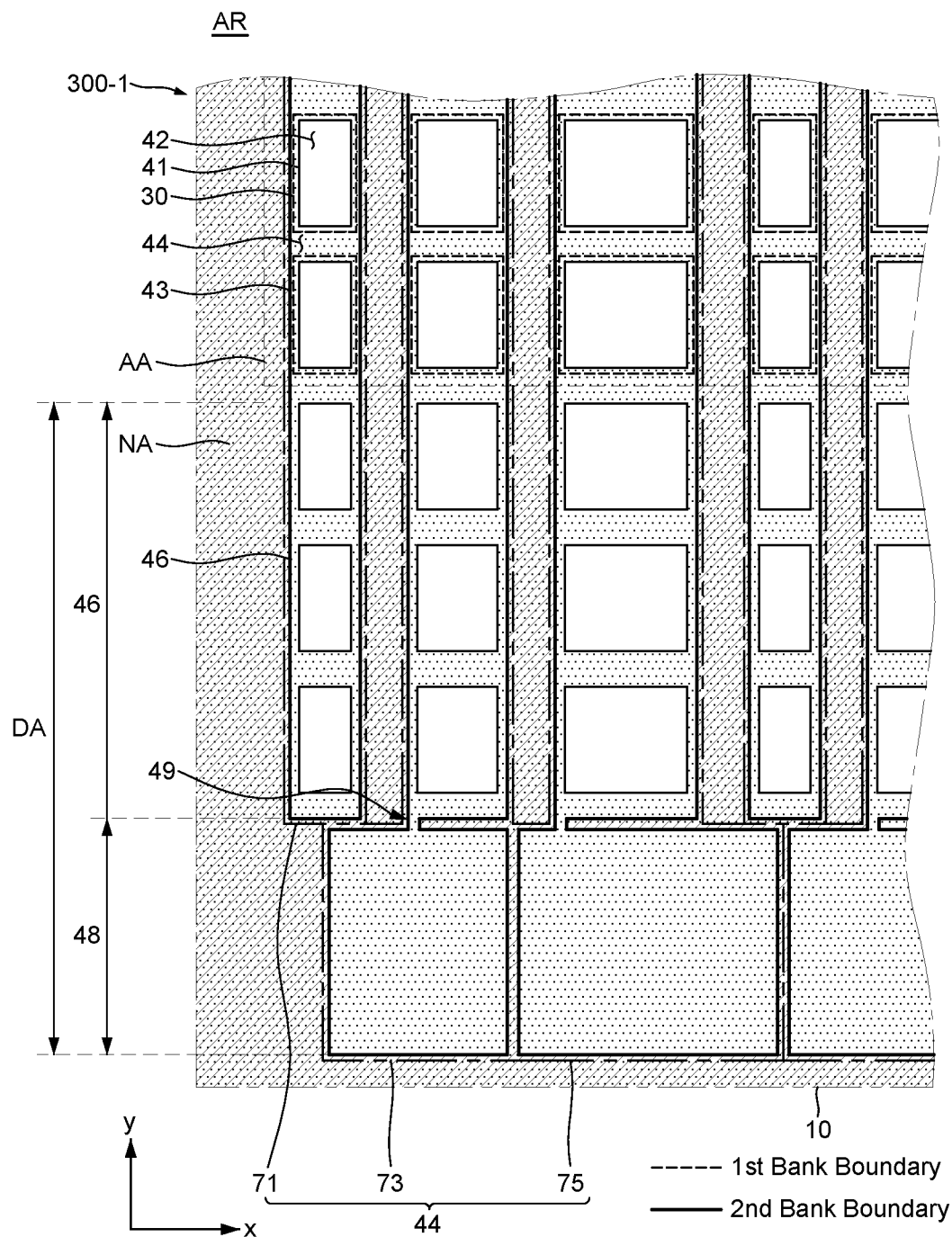
FIG. 14 is a plan view showing another example of an organic light emitting display device according to a third embodiment of the present disclosure.

FIG. 12 schematically illustrates an organic light emitting display device according to a third embodiment of the present disclosure, and is an enlarged plan view of the AR area of FIG. 1. FIG. 13 is a plan view showing a planar shape of a second opening of an organic light emitting display device according to a third embodiment of the present disclosure. FIG. 14 is a plan view showing another example of an organic light emitting display device according to a third embodiment of the present disclosure.

Referring to FIG. 12, the organic light emitting display device 300 according to the third embodiment of the present disclosure includes a substrate 10 including a display area AA in which sub-pixels SP are arranged and a non-display area NA disposed outside the display area AA. Although not shown in FIG. 12, on the substrate 10, the circuit layer 20 including the thin film transistor 21, the passivation layer 27, and the overcoat layer 28 may be included in the same manner as in the above-described second embodiment.

The sub-pixels SP may be arranged along a first direction and a second direction intersecting each other. In the sub-pixels SP, the first electrode 30 of the organic light emitting diode is disposed. The first electrode 30 may be assigned to each of the sub-pixels SP.

On the first electrode 30, a bank 40 is disposed. The bank 40 includes a first bank 41 and a second bank 43.

The first bank 41 is positioned on the first electrode 30. The first bank 41 includes a first opening 42 exposing at least a portion of the first electrode 30 and may have hydrophilic properties. The first bank 41 is formed over the entire display area AA and the non-display area NA. The non-display area NA may further include a dummy area DA. The dummy area DA is an area adjacent to the second direction from the display area AA.

On the substrate 10 on which the first bank 41 is formed, the second bank 43 is located. The second bank 43 includes a second opening 44 exposing at least a portion of the first electrode 30. The plurality of second openings 44 are arranged side by side in the first direction, and each extends in the second direction. The second opening 44 extends in the second direction to expose a plurality of first electrodes 30 disposed along the second direction. Alternatively, the second opening 44 extends in the second direction to expose a plurality of first openings 42 disposed along the second direction. The second bank 43 may have hydrophobic characteristics.

The second opening 44 is spaced apart from the outside of the first opening 42. That is, the boundary of the first bank 41 is separated from the boundary of the second bank 43 by a predetermined interval. Accordingly, the first opening 42 may be exposed by the second opening 44. The second bank 43 is disposed in the display area AA, and the second opening 44 exposes a plurality of first electrodes 30 arranged in the display area AA.

The second bank 43 includes a first dummy opening 46 disposed in the non-display area NA. The first dummy opening 46 is formed in the dummy area DA of the non-display area NA to expose the first bank 41 disposed in the dummy area DA. The dummy area DA is a non-display area NA in which a thin film transistor and an organic light emitting diode are not disposed. Accordingly, the first dummy opening 46 exposes the first bank 41 and the overcoat layer 28 exposed by the first opening 42 of the first bank 41 in the dummy area DA. The first dummy opening 46 is disposed to extend in the same second direction as the second opening 44 is extended.

Meanwhile, the second bank 43 includes a second dummy opening 48 extending from the first dummy opening 46. The second dummy opening 48 extends from the first dummy opening 46 and extends in the second direction. The second dummy opening 48 is disposed adjacent to the outside of the substrate 10 and is disposed in the display area AA in the order of the first dummy opening 46 and the second dummy opening 48 in the outward direction of the substrate 10.

The organic light emitting layer 50 is positioned on the substrate 10 on which the second bank 43 is formed. The organic light emitting layer 50 may be formed along the corresponding second opening 44. That is, the organic light emitting material dropped on the second opening 44 covers the first electrodes 30 and the first banks 41 exposed by the second opening 44, and is not physically separated by the first bank 41. Further, the organic light emitting material dropped on the first dummy opening 46 and the second dummy opening 48 covers the first bank 41 and the overcoat layer 28 disposed thereunder and is not physically separated by the first bank 41.

On the plurality of first electrodes 30 exposed by the second opening 44, an organic light emitting material of the same color is dropped. This means that light of the same color is emitted from a plurality of sub-pixels SP allocated to a position corresponding to one second opening 44. In addition, the first dummy opening 46 extending in the same direction as the second opening 44 is also loaded with the organic light emitting material of the same color, and the second dummy opening 48 extending from the first dummy opening 46 is also loaded with the organic light emitting material of the same color. The planar shape of the organic light emitting layer 50 may correspond to the planar shape of the second opening 44.

The organic light emitting materials having different colors may be sequentially and alternately dropped on the corresponding second opening 44, first dummy opening 46, and second dummy opening 48, respectively. The organic light emitting materials of different colors may include organic light emitting materials emitting red R light, green G light, and blue B light, and if necessary, the organic light emitting materials emitting white W light may be further included.

The second bank 43 is positioned between the first electrodes 30 neighboring in the first direction, and thus, the organic light emitting materials of different colors respectively dropped in the second opening 44, the first dummy opening 46, and the second dummy opening 48 neighboring in the first direction are not mixed with each other. That is, the organic light emitting materials of different colors respectively dropped in the different second openings 44, the first dummy openings 46, and the second dummy openings 48 are physically separated by the second bank 43.

As described above, in the third embodiment of the present disclosure, the second opening 44 of the dummy area DA may include all of the first dummy openings 46 and may include a second dummy opening 48 extending from some of the first dummy openings 46.

Specifically, the second openings 44 of the second bank 43 include a first column 71, a second column 73, and a third column 75 including different organic light emitting layers. In each of the first column 71, the second column 73, and the third column 75, the second bank 43 includes a first dummy opening 46 disposed in the dummy area DA of the non-display area NA. Also, the second dummy opening 48 extending from the first dummy opening 46 of each of the second column 73 and the third column 75 may be included. Each of the second dummy openings 48 includes a bottleneck part 49. The bottleneck part 49 of the second dummy opening 48 may be defined as an area having a width narrower than the width of the first dummy opening 46 at the end of the first dummy opening 46.

As described in the above-described first embodiment, when the organic light emitting material is dried after dropping, the organic light emitting material quickly dries in the outer portion of the display area AA and agglomerates to the central portion of the display area AA, so that the thickness of the organic light emitting layer is formed non-uniformly.

The organic light emitting display device 300 according to the third embodiment of the present disclosure, in the non-display area NA other than the display area AA, the dummy area DA is provided and the first dummy opening 46 and the second dummy opening 48 of the second opening 44 disposed in the dummy area DA may be provided. The first dummy opening 46 and the second dummy opening 48 store the dropped organic light emitting material. The organic light emitting material stored in the first dummy opening 46 and the second dummy opening 48 may be filled in the second opening 44 of the display area AA, and the movement of the organic light emitting material may be reduced to the display area AA.

For example, when the organic light emitting material dropped on the second opening 44 disposed at the edge portion of the display area AA is rapidly dried and agglomerates to the central portion, the second opening 44 disposed on the edge of the display area AA is filled with the organic light emitting material dropped on the first dummy opening 46 and the second dummy opening 48 disposed in the dummy area DA. That is, since the organic light emitting material is continuously supplied to the second opening 44 disposed in the edge portion of the display area AA, the amount of the organic light emitting material in the second opening 44 disposed in the edge portion can be maintained. Accordingly, since the thickness of the organic light emitting layer formed after drying the organic light emitting material may be uniformly formed in the edge portion and the center portion of the display area AA, and thus, luminance uniformity can be improved, and the display quality can be improved.

The first dummy opening 46 of the present disclosure has a shape extending to the non-display area NA in the same manner as the shape of the second opening 44 of the display area AA. The second dummy opening 48 extends in the same direction as the first dummy opening 46 but has a different planar shape. The second dummy opening 48 extends on one side of the first dummy opening 46 but is bent and protrudes into adjacent column. For example, the second dummy opening 48 of the second column 73 is disposed to protrude to the adjacent first column 71 and third column 75. The second dummy opening 48 of the third column 75 is disposed to protrude to the adjacent third column 75.

The second dummy openings 48 disposed in each of the second column 73 and the third column 75 may have different planar areas. As described above, a red light emitting layer is formed in the second opening 44 formed in the first column 71, a green light emitting layer is formed in the second opening 44 formed in the second column 73, and a blue light emitting layer is formed in the second opening 44 formed in the third column 75. Differences in the planar area of the second dummy openings 48 formed in the first to third columns 71, 73, and 75, respectively, may be adjusted according to light emission characteristics of each light emitting layer.

In the second opening 44 of the first column 71 in which the red light emitting layer having the narrowest width is formed, a large amount of red organic light emitting material is dropped compared to the surface area, so that the degree of curling of the edge portion is relatively small Therefore, the second dummy opening 48 is not provided in the first column 71 in which the red light emitting layer is formed.

On the other hand, in the second opening 44 of the second column 73 in which the green light emitting layer is formed having a width greater than that of the second opening 44 in the first column 71 in which the red light emitting layer is formed, a relatively small amount of the green organic light emitting material is dropped compared to the surface area, so that relatively more liquid curling phenomenon at the edge is occurred. Therefore, the second dummy opening 48 of the second column 73 in which the green light emitting layer is formed is formed to be the largest, so that the amount of the organic light emitting material moving from the second dummy opening 48 is increased to increase the amount of the organic light emitting material filled in the second opening 44 of the display area AA.

In addition, in the second opening 44 of the third column 75 in which the blue light emitting layer is formed having a width greater than that of the second opening 44 in the second column 73 in which the green light emitting layer is formed, a relatively small amount of the blue organic light emitting material is dropped compared to the surface area, so that relatively more liquid curling phenomenon at the edge occurs. However, the visibility of the liquid curling phenomenon of blue is relatively inferior to that of green. Therefore, the second dummy opening 48 of the third column 75 in which the blue light emitting layer is formed is formed to have smaller planar area than the second dummy opening 48 of the second column 73, so that the amount of the organic light emitting material moving from the second dummy opening 48 is adjusted to control the amount of the organic light emitting material filled in the second opening 44 of the display area AA.

The organic light emitting display device 300 according to the third embodiment of the present disclosure does not include a second dummy opening in the first column 71, the planar area of the second dummy opening 48 of the second column 73 may be formed larger in the direction of the first column 71. Therefore, it is possible to further suppress luminance unevenness due to variation in the thickness of the organic light emitting layer in the second column 73 in which the green light emitting layer most vulnerable to liquid curling is formed.

As in the second embodiment described above, the second dummy opening 48 of the present disclosure may have different planar areas in the second column 73 and the third column 75. To this end, the widths of the second dummy openings 48 may be different from each other.

Specifically, referring to FIGS. 12 and 13, the width W2 of the second dummy opening 48 disposed in the second column 73 may be wider than the width W3 of the second dummy openings 48 disposed in the third column 75. In addition, the width W3 of the second dummy opening 48 disposed in the third column 75 may be narrower than the widths W2 of the second dummy opening 48 disposed in the second column 73. Accordingly, as described above, by adjusting the width of the second dummy openings formed in each column in consideration of visibility of liquid curling phenomenon for each color emitted by the organic light emitting layer, a decrease in display quality due to variation in thickness of the organic light emitting layer according to the position can be remarkably improved.

In addition, the width W5 of the bottleneck part 49 included in the second dummy opening 48 of the present disclosure may be made narrower than the width W6 of the first dummy opening 46. The width W5 of the bottleneck part 49 may be 20% to 40% of the width W6 of the first dummy opening 46. Therefore, it is possible to reduce the thickness variation of the organic light emitting layer according to the position by suppressing the liquid curling phenomenon of the edge portion of the display area AA.

In addition, sum W2+W3 of the total widths W2 and W3 of the second dummy openings 48 disposed in the second column 73 and the third column 75 may be equal to or smaller than the overall width of the second openings 44 arranged in the first column 71 to the third column 75 of the display area AA.

Meanwhile, in FIG. 12, the planar area of the second dummy opening 48 in the second column 73 is formed larger, and the planar area of the second dummy opening 48 in the third column 75 is formed relatively smaller. However, as illustrated in FIG. 14, the organic light emitting display device 300-1 according to the 3-1 embodiment of the present disclosure largely forms the planar area of the second dummy opening 48 in the third column 75, and may form a relatively small planar area of the second dummy opening 48 in the second column 73. That is, as illustrated in FIGS. 12 and 14, the area of the second dummy opening 48 in which the green or blue light emitting layer is formed may be variously adjusted according to visibility due to the liquid curling phenomenon.

As described above, the organic light emitting display device 100 according to the first embodiment of the present disclosure, during the curing process of the organic light emitting material, the organic light emitting material may be gathered to the central portion of the display area, and the edge portion curling phenomenon in which the amount of the organic light emitting material is relatively reduced at the edge portion may occur. According to the organic light emitting display device 300 of the third embodiment of the present disclosure, by forming the first dummy opening and the second dummy opening in the dummy area DA of the non-display area NA, the organic light emitting material is held so that the organic light emitting material does not gather from the edge portion, that is, the dummy area DA, to the center of the display area AA. In addition, by generating a capillary phenomenon, the organic light emitting material may be formed in the dummy area DA to have a uniform thickness. In particular, as with the organic light emitting display device 300-1 according to the 3-1 embodiment of the present disclosure, by providing the second dummy opening in the second column and the third column in a large width without having the second dummy opening in the first column in which the red light emitting layer having little effect of liquid curling is formed, there is an advantage in that a decrease in display quality due to variation in thickness of the organic light emitting layer according to the position of the green or blue light emitting layer having high visibility in terms of liquid curling phenomenon can be remarkably improved.

The Fourth Embodiment

Figure 15:
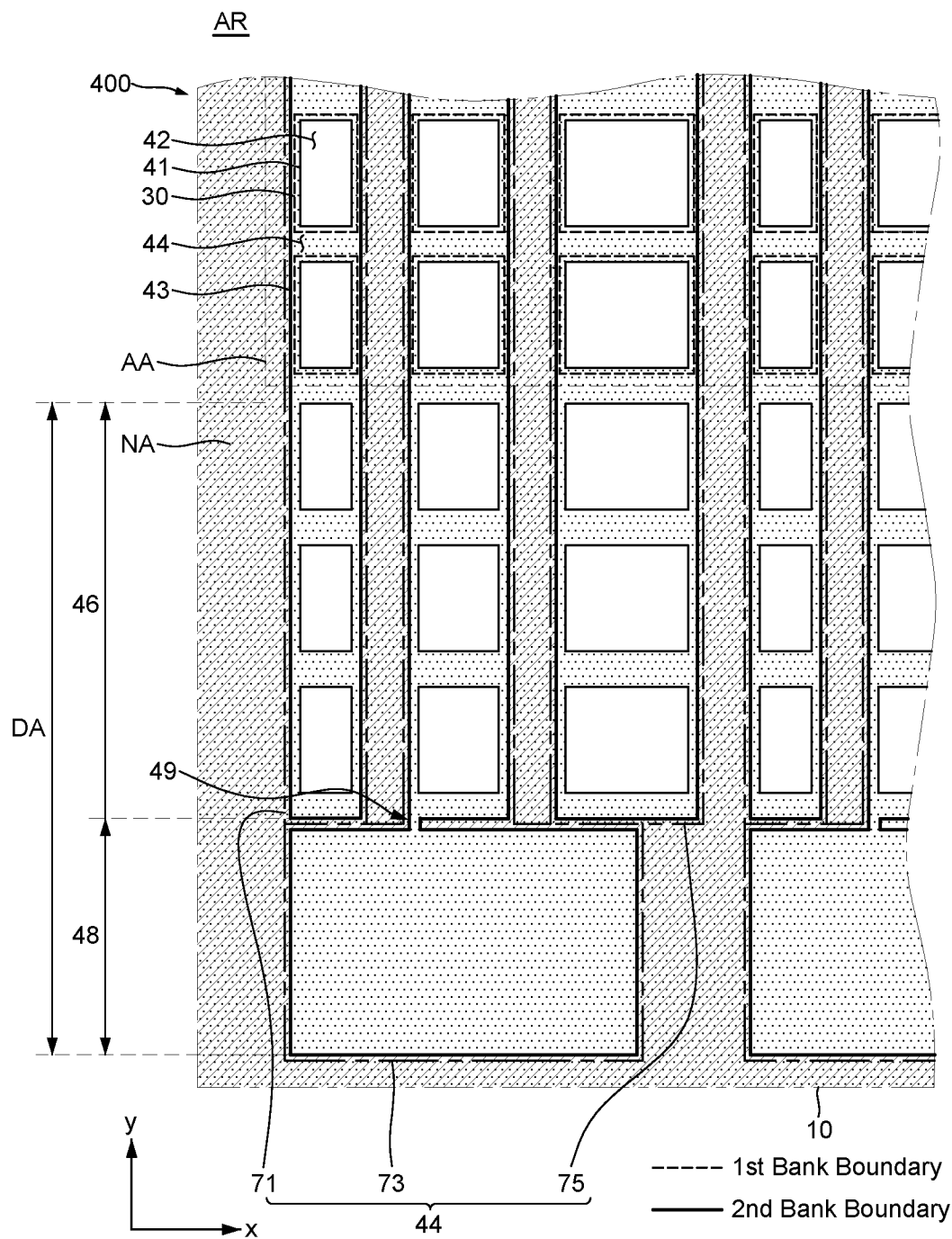
FIG. 15 is a plan view schematically showing an organic light emitting display device according to a fourth embodiment of the present disclosure.
Figure 16:
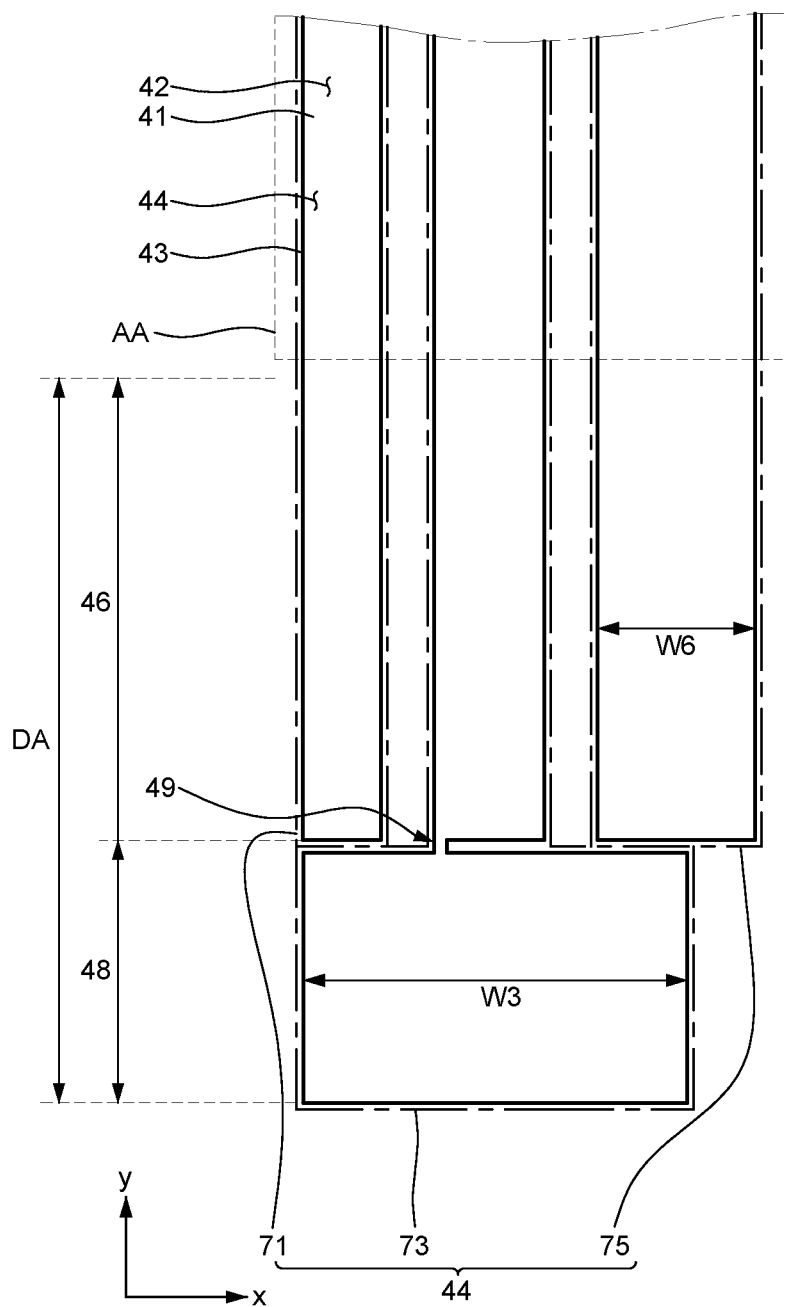
FIG. 16 is a plan view showing a planar shape of a second opening of an organic light emitting display device according to a fourth embodiment of the present disclosure.
Figure 17:
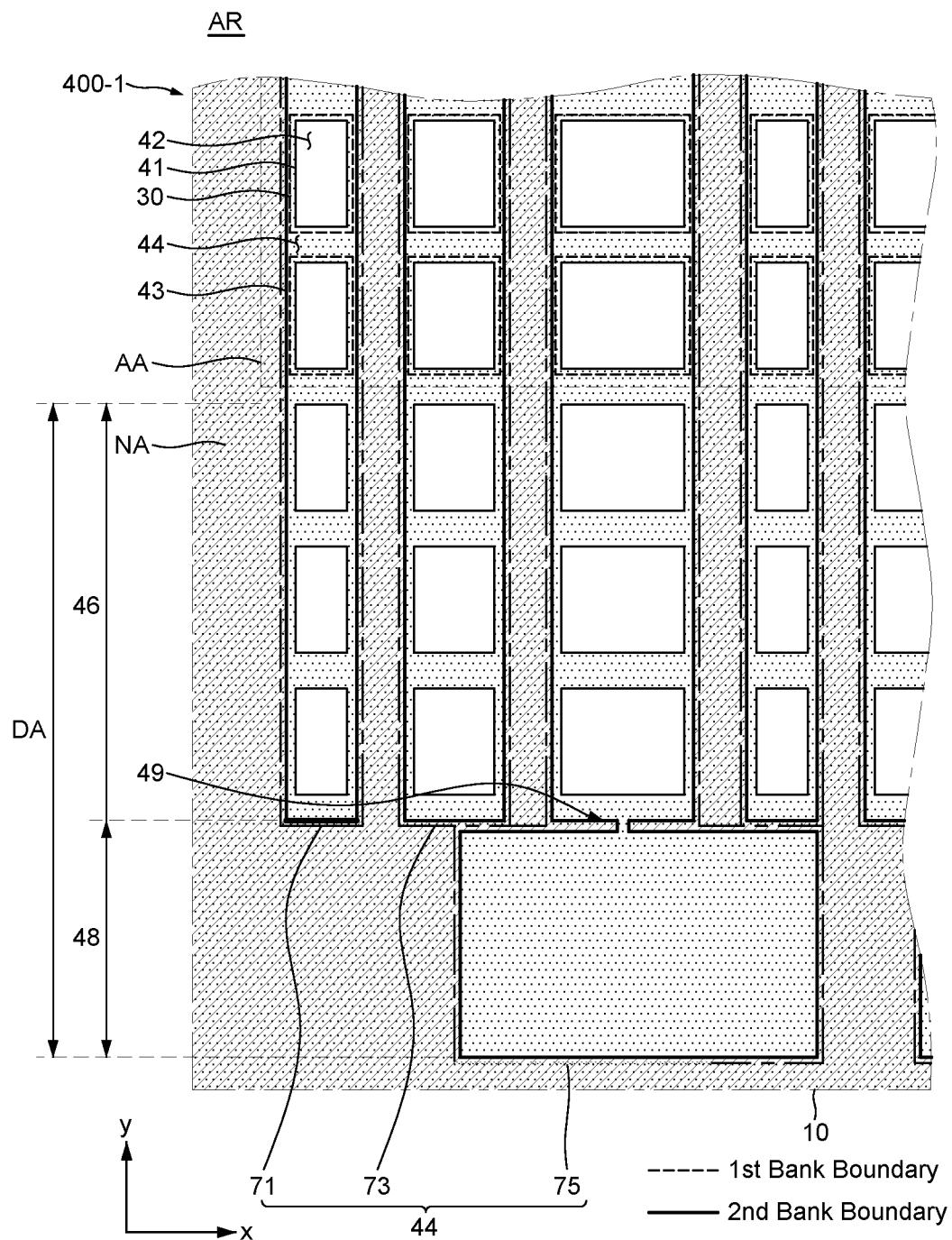
FIG. 17 is a plan view showing another example of the organic light emitting display device according to the fourth embodiment of the present disclosure.
Figure 18:
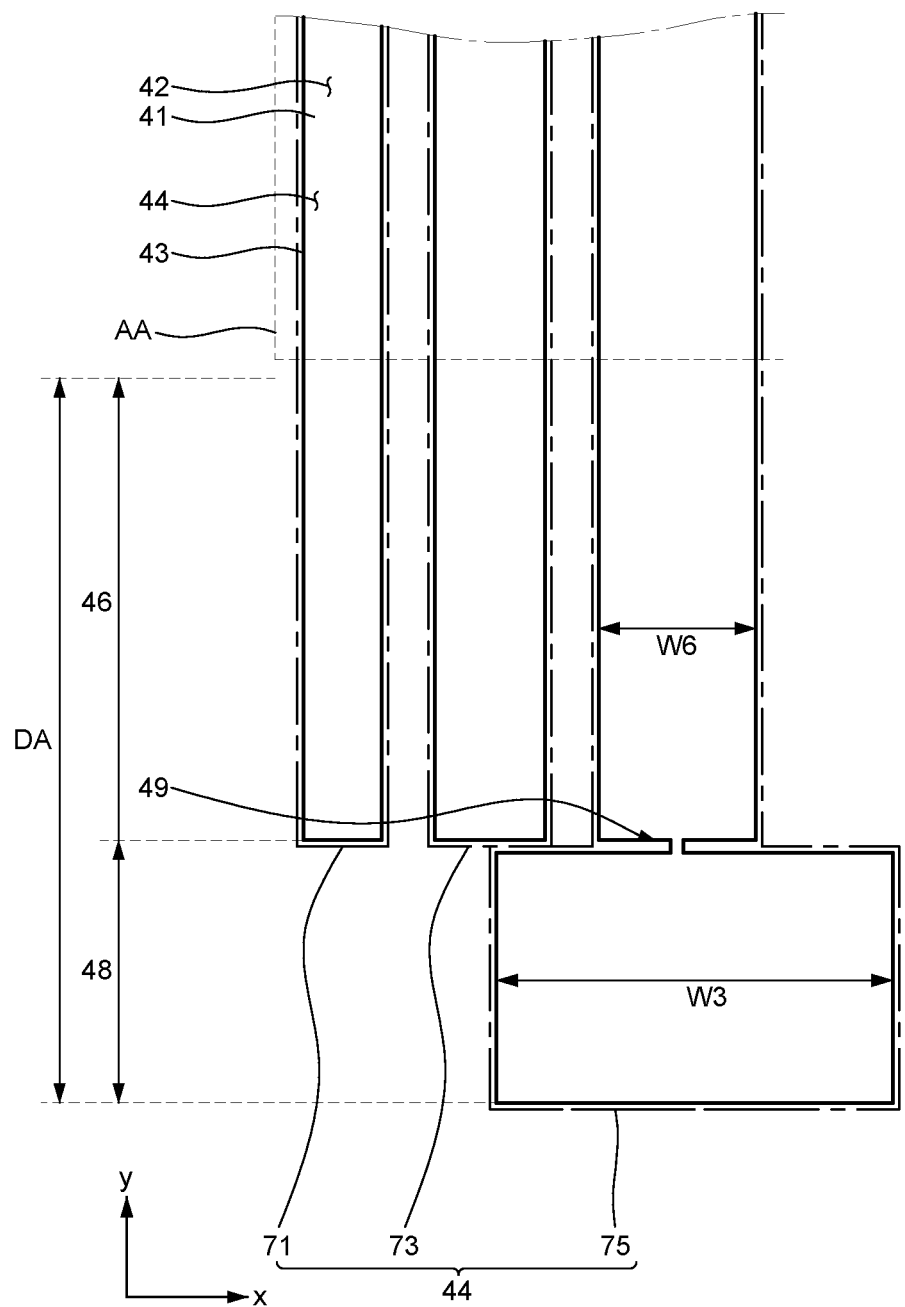
FIG. 18 is a plan view showing another example of planar shape of a second opening of an organic light emitting display device according to a fourth embodiment of the present disclosure.

FIG. 15 schematically illustrates an organic light emitting display device according to a fourth embodiment of the present disclosure, and is an enlarged plan view of the AR area of FIG. 1. FIG. 16 is a plan view showing a planar shape of a second opening of an organic light emitting display device according to a fourth embodiment of the present disclosure. FIG. 17 is a plan view showing another example of an organic light emitting display device according to a fourth embodiment of the present disclosure. FIG. 18 is a plan view showing another example of planar shape of a second opening of an organic light emitting display device according to a fourth embodiment of the present disclosure.

Referring to FIG. 15, the organic light emitting display device 300 according to the fourth embodiment of the present disclosure includes a substrate 10 including a display area AA in which sub-pixels SP are arranged and a non-display area NA disposed outside the display area AA. Although not shown on the substrate 10, the circuit layer 20 including the thin film transistor 21, the passivation layer 27, and the overcoat layer 28 may be included in the same manner as in the above-described second embodiment.

The sub-pixels SP may be arranged along a first direction and a second direction intersecting each other. In the sub-pixels SP, the first electrode 30 of the organic light emitting diode is disposed. The first electrode 30 may be assigned to each of the sub-pixels SP.

On the first electrode 30, a bank 40 is disposed. The bank 40 includes a first bank 41 and a second bank 43.

The first bank 41 is positioned on the first electrode 30. The first bank 41 includes a first opening 42 exposing at least a portion of the first electrode 30 and may have hydrophilic properties. The first bank 41 is formed over the entire display area AA and the non-display area NA. The non-display area NA may further include a dummy area DA. The dummy area DA is an area adjacent to the second direction from the display area AA.

On the substrate 10 on which the first bank 41 is formed, the second bank 43 is located. The second bank 43 includes a second opening 44 exposing at least a portion of the first electrode 30. The plurality of second openings 44 are arranged side by side in the first direction, and each extends in the second direction. The second opening 44 extends in the second direction to expose a plurality of first electrodes 30 disposed along the second direction. Alternatively, the second opening 44 extends in the second direction to expose a plurality of first openings 42 disposed along the second direction. The second bank 43 may have hydrophobic characteristics.

The second opening 44 is spaced apart from the outside of the first opening 42. That is, the boundary of the first bank 41 is separated from the boundary of the second bank 43 by a predetermined interval. Accordingly, the first opening 42 may be exposed by the second opening 44. The second bank 43 is disposed in the display area AA, and the second opening 44 exposes a plurality of first electrodes 30 arranged in the display area AA.

The second bank 43 includes a first dummy opening 46 disposed in the non-display area NA. The first dummy opening 46 is formed in the dummy area DA of the non-display area NA to expose the first bank 41 disposed in the dummy area DA. The dummy area DA is a non-display area NA in which a thin film transistor and an organic light emitting diode are not disposed. Accordingly, the first dummy opening 46 exposes the first bank 41 and the overcoat layer 28 exposed by the first opening 42 of the first bank 41 in the dummy area DA. The first dummy opening 46 is disposed to extend in the same second direction as the second opening 44 is extended.

Meanwhile, the second bank 43 includes a second dummy opening 48 extending from the first dummy opening 46. The second dummy opening 48 extends from the first dummy opening 46 and extends in the second direction. The second dummy opening 48 is disposed adjacent to the outside of the substrate 10 and is disposed in the display area AA in the order of the first dummy opening 46 and the second dummy opening 48 in the outward direction of the substrate 10.

The organic light emitting layer 50 is positioned on the substrate 10 on which the second bank 43 is formed. The organic light emitting layer 50 may be formed along the corresponding second opening 44. That is, the organic light emitting material dropped on the second opening 44 covers the first electrodes 30 and the first banks 41 exposed by the second opening 44, and is not physically separated by the first bank 41. Further, the organic light emitting material dropped on the first dummy opening 46 and the second dummy opening 48 covers the first bank 41 and the overcoat layer 28 disposed thereunder and is not physically separated by the first bank 41.

On the plurality of first electrodes 30 exposed by the second opening 44, an organic light emitting material of the same color is dropped. This means that light of the same color is emitted from a plurality of sub-pixels SP allocated to a position corresponding to one second opening 44. In addition, the first dummy opening 46 extending in the same direction as the second opening 44 is also loaded with the organic light emitting material of the same color, and the second dummy opening 48 extending from the first dummy opening 46 is also loaded with the organic light emitting material of the same color. The planar shape of the organic light emitting layer 50 may correspond to the planar shape of the second opening 44.

The organic light emitting materials having different colors may be sequentially and alternately dropped on the corresponding second opening 44, first dummy opening 46, and second dummy opening 48, respectively. The organic light emitting materials of different colors may include organic light emitting materials emitting red R, green G, and blue B, and if necessary, the organic light emitting materials emitting white W may be further included.

The second bank 43 is positioned between the first electrodes 30 neighboring in the first direction, and thus, the organic light emitting materials of different colors respectively dropped in the second opening 44, the first dummy opening 46, and the second dummy opening 48 neighboring in the first direction are not mixed with each other. That is, the organic light emitting materials of different colors respectively dropped in the different second openings 44, the first dummy openings 46, and the second dummy openings 48 are physically separated by the second bank 43.

As described above, in an organic light emitting display device 400 according to the fourth embodiment of the present disclosure, the second opening 44 of the dummy area DA may include all of the first dummy openings 46 and may include a second dummy opening 48 extending from some of the first dummy openings 46.

Specifically, the second openings 44 of the second bank 43 include a first column 71, a second column 73, and a third column 75 including different organic light emitting layers. In each of the first column 71, the second column 73, and the third column 75, the second bank 43 includes a first dummy opening 46 disposed in the dummy area DA of the non-display area NA. Also, the second dummy opening 48 extending from the first dummy opening 46 of the second column 73 may be included. The second dummy opening 48 includes a bottleneck part 49. The bottleneck part 49 of the second dummy opening 48 may be defined as an area having a width narrower than the width of the first dummy opening 46 at the end of the first dummy opening 46.

As described in the above-described first embodiment, when the organic light emitting material is dried after dropping, the organic light emitting material quickly dries in the outer portion of the display area AA and agglomerates to the central portion of the display area AA, so that the thickness of the organic light emitting layer is formed non-uniformly.

The organic light emitting display device 400 according to the fourth embodiment of the present disclosure, in the non-display area NA other than the display area AA, the dummy area DA is provided and the first dummy opening 46 and the second dummy opening 48 of the second opening 44 disposed in the dummy area DA may be provided. The first dummy opening 46 and the second dummy opening 48 store the dropped organic light emitting material. The organic light emitting material stored in the first dummy opening 46 and the second dummy opening 48 may be filled in the second opening 44 of the display area AA, and the movement of the organic light emitting material may be reduced to the display area AA.

For example, when the organic light emitting material dropped on the second opening 44 disposed at the edge portion of the display area AA is rapidly dried and agglomerates to the central portion of the display area AA, the second opening 44 disposed on the edge of the display area AA is filled with the organic light emitting material dropped on the first dummy opening 46 and the second dummy opening 48 disposed in the dummy area DA. That is, since the organic light emitting material is continuously supplied to the second opening 44 disposed in the edge portion of the display area AA, the amount of the organic light emitting material in the second opening 44 disposed in the edge portion can be maintained. Accordingly, since the thickness of the organic light emitting layer formed after drying the organic light emitting material may be uniformly formed in the edge portion and the center portion of the display area AA, and thus, luminance uniformity can be improved, and the display quality can be improved.

The first dummy opening 46 of the present disclosure has a shape extending to the non-display area NA in the same manner as the shape of the second opening 44 of the display area AA. The second dummy opening 48 extends in the same direction as the first dummy opening 46 but has a different planar shape. The second dummy opening 48 extends on one side of the first dummy opening 46 but is bent and protrudes into adjacent columns. For example, the second dummy opening 48 of the second column 73 is disposed to protrude to the adjacent first column 71 and third column 75.

The second dummy opening 48 disposed in the second column 73 may have a larger planar area. As described above, a red light emitting layer is formed in the second opening 44 formed in the first column 71, a green light emitting layer is formed in the second opening 44 formed in the second column 73, and a blue light emitting layer is formed in the second opening 44 formed in the third column 75. The planar area of the second dummy opening 48 formed in the second column 73 may be adjusted according to light emission characteristics of each light emitting layer.

In the second opening 44 of the first column 71 in which the red light emitting layer having the narrowest width is formed, a large amount of red organic light emitting material is dropped compared to the surface area, so that the degree of curling of the edge portion is relatively small Therefore, the second dummy opening 48 is not provided in the first column 71 in which the red light emitting layer is formed.

On the other hand, in the second opening 44 of the second column 73 in which the green light emitting layer is formed having a width greater than that of the second opening 44 in the first column 71 in which the red light emitting layer is formed, a relatively small amount of the green organic light emitting material is dropped compared to the surface area, so that relatively more liquid curling phenomenon at the edge is occurred. Therefore, the second dummy opening 48 of the second column 73 in which the green light emitting layer is formed is formed to be large, so that the amount of the organic light emitting material moving from the second dummy opening 48 is increased to increase the amount of the organic light emitting material filled in the second opening 44 of the display area AA.

In addition, in the second opening 44 of the third column 75 in which the blue light emitting layer is formed having a width greater than that of the second opening 44 in the second column 73 in which the green light emitting layer is formed, a relatively small amount of the blue organic light emitting material is dropped compared to the surface area, so that relatively more liquid curling phenomenon at the edge is occurred. However, the visibility of the liquid curling phenomenon of blue is relatively inferior to that of green. Therefore, the third column 75 on which the blue light emitting layer is formed does not include the second dummy opening 48.

The organic light emitting display device 400 according to the forth embodiment of the present disclosure does not include a second dummy opening in the first column 71 and the third column 75, the planar area of the second dummy opening 48 of the second column 73 may be formed larger in the direction of the first column 71 and the third column 75. Therefore, it is possible to further suppress luminance unevenness due to variation in the thickness of the organic light emitting layer in the second column 73 in which the green light emitting layer most vulnerable to liquid curling is formed.

Referring to FIG. 16, the width W3 of the second dummy opening 48 disposed in the second column 73 may be equal to or smaller than the overall width of the second openings 44 arranged in the first column 71 to the third column 75 of the display area AA. Therefore, as described above, by forming the width of the second dummy opening formed in the second column very large in consideration of the visibility of the liquid curling phenomenon for each color emitted by the organic light emitting layer, a decrease in display quality due to variation in thickness of the organic light emitting layer according to the position can be remarkably improved.

In addition, the width W5 of the bottleneck part 49 included in the second dummy opening 48 of the present disclosure may be made narrower than the width W6 of the first dummy opening 46. The width W5 of the bottleneck part 49 may be 20% to 40% of the width W6 of the first dummy opening 46. Therefore, it is possible to reduce the thickness variation of the organic light emitting layer according to the position by suppressing the liquid curling phenomenon of the edge portion of the display area AA.

Meanwhile, in FIG. 15, the planar area of the second dummy opening 48 in the second column 73 is formed to be large, and the second dummy opening 48 is not provided in the first column 71 and the third column 75. However, as illustrated in FIG. 17, in the organic light emitting display device 400-1 according to the 4-1 embodiment of the present disclosure, the planar area of the second dummy opening 48 in the third column 75 may be large, and the second dummy opening 48 may not be provided in the first column 71 and the second column 73. That is, as illustrated in FIGS. 15 and 17, the second dummy opening 48 may be formed in the column in which the green or blue light emitting layer is formed according to visibility due to the liquid curling phenomenon.

As described above, the organic light emitting display device 100 according to the first embodiment of the present disclosure, during the curing process of the organic light emitting material, the organic light emitting material may be gathered to the central portion of the display area, and the edge portion curling phenomenon in which the amount of the organic light emitting material is relatively reduced at the edge portion may occur. According to the organic light emitting display device 400 of the fourth embodiment of the present disclosure, by forming the first dummy opening and the second dummy opening in the dummy area DA of the non-display area NA, the organic light emitting material is held so that the organic light emitting material does not gather from the edge portion, that is, the dummy area DA, to the center of the display area AA. In addition, by generating a capillary phenomenon, the organic light emitting material may be formed in the dummy area DA to have a uniformed thickness. In particular, as with the organic light emitting display device 400-1 according to the 4-1 embodiment of the present disclosure, by providing the second dummy opening in the second column in a large width without having the second dummy opening in the first column in which the red and blue light emitting layers having little effect of liquid curling is formed, there is an advantage in that a decrease in display quality due to variation in thickness of the organic light emitting layer according to the position of the green light emitting layer having high visibility in terms of liquid curling phenomenon can be remarkably improved.

Through the above description, those skilled in the art will be able to variously change and modify without departing from the technical spirit of the present disclosure. Therefore, the technical scope of the present disclosure should not be limited to the contents described in the detailed description of the specification, but should be determined by the scope of the claims.

What is claimed is:

1. An organic light emitting display device comprising:
a substrate including a display area and a non-display area, the display area including a plurality of sub-pixels and the non-display area surrounds the plurality of sub-pixels in a plan view of the organic light emitting display device;
an overcoat layer disposed on the display area and the non-display area of the substrate;
a plurality of transistors assigned to the plurality of sub-pixels in the display area;
a plurality of first electrodes assigned to the plurality of sub-pixels that are each connected to a corresponding transistor from the plurality of transistors, the plurality of first electrodes disposed on the overcoat layer in the display area without the plurality of first electrodes being disposed on the overcoat layer in the non-display area;
a first bank disposed in the display area and the non-display area, the first bank including a plurality of first openings in the display area that expose the plurality of first electrodes;
a second bank disposed on the first bank which is disposed in the display area and the non-display area, the second bank including a plurality of second openings in the display area that expose the plurality of first electrodes arranged in one direction; and
an organic light emitting layer disposed on the plurality of second openings, respectively,
wherein in the non-display area, the plurality of second openings each include a first dummy opening adjacent to the display area, the first dummy opening exposing a portion of the overcoat layer in the non-display area without the plurality of first electrodes being between the exposed portion of the overcoat layer and the organic light emitting layer in the plurality of second openings in the non-display area, wherein at least one second opening among the plurality of second openings includes a second dummy opening extending from the first dummy opening in the non-display area, wherein the second dummy opening includes a bottleneck part that is directly connected to the first dummy opening that exposes the portion of the overcoat layer in the non-display area, the bottleneck part has a constant width that is narrower than a width of an end of the first dummy opening that is directly connected to the bottleneck part, wherein a thickness of the first bank in the non-display area is less than a thickness of the organic light emitting layer in the non-display area such that the organic light emitting layer covers an upper surface of the first bank in the non-display area and the first bank in the non-display area is non-overlapping with one of the plurality of first electrodes and one of the plurality of transistors, wherein a thickness of a first portion of the organic light emitting layer in the first dummy opening is different from a thickness of a second portion of the organic light emitting layer in the second dummy opening.

2. The organic light emitting display device of claim 1, wherein the first dummy opening is overlapped with the plurality of first openings of the first bank in the non-display area.

3. The organic light emitting display device of claim 2, wherein the second dummy opening is disposed adjacent to an outermost portion of the substrate, and at least partially overlaps the overcoat layer.

4. The organic light emitting display device of claim 2, wherein the second dummy opening is non-overlapping with the overcoat layer.

5. The organic light emitting display device of claim 2, wherein the second dummy opening is non-overlapping with the plurality of first openings of the first bank.

6. The organic light emitting display device of claim 3, wherein the plurality of second openings include a first column in which first organic light emitting layers are formed, a second column in which second organic light emitting layers different from the first organic light emitting layers in the first column are formed, and a third column in which third organic light emitting layers different from the first organic light emitting layers in the first column and the second organic light emitting layers in the second column are formed.

7. The organic light emitting display device of claim 6, wherein the second dummy opening is included in at least one of the first column, the second column, or the third column.

8. The organic light emitting display device of claim 6, wherein the second dummy opening is included in each of the first column, the second column, and the third column, and wherein second dummy openings included in each of the first column, the second column, and the third column have different planar areas.

9. The organic light emitting display device of claim 8, wherein the second dummy opening included in the first column has a planar area smaller than planar areas of the second dummy openings included in each of the second column and the third column, and wherein, the planar area of the second dummy opening included in the second column is larger than planar areas of the second dummy openings included in the first column and the third column, respectively.

10. The organic light emitting display device of claim 7, wherein at least one of the second dummy openings is formed by bending and protruding into at least one adjacent column.

11. The organic light emitting display device of claim 8, wherein at least one of the first column to third columns does not include the second dummy opening, and the second dummy opening included in remaining columns of the first column to third column is formed by bending and protruding into adjacent columns.

12. The organic light emitting display device of claim 1, wherein the width of the bottleneck part is 20 to 40% of the width of the first dummy opening.

13. An organic light emitting display device comprising:
a substrate including a display area and a non-display area, the display area including a plurality of sub-pixels and the non-display area surrounds the plurality of sub-pixels in a plan view of the organic light emitting display device;
an overcoat layer disposed on the display area and the non-display area of the substrate;
a plurality of first electrodes assigned to the plurality of sub-pixels, the plurality of first electrodes disposed on the overcoat layer in the display area without being disposed on the overcoat layer in the non-display area;
a first bank disposed in the display area and the non-display area, the first bank including a plurality of first openings in the display area that expose the plurality of first electrodes;
a second bank disposed on the first bank which is disposed in the display area and the non-display area, the second bank including a plurality of second openings in the display area that expose the plurality of first electrodes arranged in one direction; and
an organic light emitting layer disposed on the plurality of second openings, respectively,
wherein in the non-display area, the plurality of second openings each include a first dummy opening adjacent to the display area, the first dummy opening exposing a portion of the overcoat layer in the non-display area,
wherein at least one second opening among the plurality of second openings includes a second dummy opening extending from the first dummy opening in the non-display area,
wherein the second dummy opening includes a bottleneck part that is directly connected to the first dummy opening that exposes the portion of the overcoat layer in the non-display area, the bottleneck part has a constant width that is narrower than a width of an end of the first dummy opening that is directly connected to the bottleneck part,
wherein the plurality of second openings include a first column in which first organic light emitting layers are formed, a second column in which second organic light emitting layers different from the first organic light emitting layers in the first column are formed, and a third column in which third organic light emitting layers different from the first organic light emitting layers in the first column and the second organic light emitting layers in the second column are formed, wherein each of the second column and the third column include second dummy openings having a rectangular shape, wherein the second dummy openings included in the second column and the second dummy openings included in the third column have a same length in a Y-axis direction and have different lengths in a X-axis direction that are perpendicular to each other, and wherein a center point of a second dummy opening from the second dummy openings in the second column and a center point of a second dummy opening from the second dummy openings in the third column form one straight line, and the one straight line is parallel to the X-axis direction.

14. The organic light emitting display device of claim 1, wherein the thickness of the second portion of the organic light emitting layer in the second dummy opening is greater than the thickness of the first portion of the organic light emitting layer in the first dummy opening.

\* \* \* \* \*